US010410921B2

(12) United States Patent
Zhang et al.

(10) Patent No.: US 10,410,921 B2
(45) Date of Patent: Sep. 10, 2019

(54) FULLY SELF-ALIGNED VIA

(71) Applicant: Micromaterials LLC, Wilmington, DE (US)

(72) Inventors: Ying Zhang, Santa Clara, CA (US); Abhijit Basu Mallick, Palo Alto, CA (US); Regina Freed, Los Altos, CA (US); Nitin K. Ingle, Santa Clara, CA (US); Uday Mitra, Cupertino, CA (US); Ho-yung David Hwang, Cupertino, CA (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/272,059

(22) Filed: Feb. 11, 2019

(65) Prior Publication Data

US 2019/0189512 A1    Jun. 20, 2019

Related U.S. Application Data

(62) Division of application No. 15/679,458, filed on Aug. 17, 2017.

(Continued)

(51) Int. Cl.
*H01L 21/768* (2006.01)
*H01L 23/528* (2006.01)
(Continued)

(52) U.S. Cl.
CPC .. *H01L 21/76897* (2013.01); *H01L 21/76805* (2013.01); *H01L 21/76834* (2013.01);
(Continued)

(58) Field of Classification Search
CPC ......... H01L 21/76897; H01L 21/76805; H01L 21/76834
See application file for complete search history.

(56) References Cited

U.S. PATENT DOCUMENTS 6,653,200 B2   11/2003  Olsen
8,575,753 B2   11/2013  Choi et al.
(Continued)

FOREIGN PATENT DOCUMENTS

JP   2008108757 A    5/2008
JP   2011233922 A   11/2011
WO  20171136577 A1   8/2017

OTHER PUBLICATIONS

PCT International Search Report and Written Opinion in PCT/US2017/053936 dated Jan. 12, 2018, 10 pages.

(Continued)

*Primary Examiner* — Errol V Fernandes
(74) *Attorney, Agent, or Firm* — Servilla Whitney LLC

(57) ABSTRACT

A first metallization layer comprising a set of first conductive lines that extend along a first direction on a first insulating layer on a substrate. A second insulating layer is on the first insulating layer. A second metallization layer comprises a set of second conductive lines on a third insulating layer and on the second insulating layer above the first metallization layer. The set of second conductive lines extend along a second direction that crosses the first direction at an angle. A via between the first metallization layer and the second metallization layer. The via is self-aligned along the second direction to one of the first conductive lines.

14 Claims, 17 Drawing Sheets

Related U.S. Application Data

(60) Provisional application No. 62/481,301, filed on Apr. 4, 2017.

(51) Int. Cl.
*H01L 23/48* (2006.01)
*H01L 23/532* (2006.01)

(52) U.S. Cl.
CPC ...... *H01L 21/76877* (2013.01); *H01L 23/481* (2013.01); *H01L 23/528* (2013.01); *H01L 23/5329* (2013.01); *H01L 23/53238* (2013.01); *H01L 23/53252* (2013.01); *H01L 23/53266* (2013.01)

(56) References Cited

U.S. PATENT DOCUMENTS

| | | | |
|---|---|---|---|
| 8,951,429 | B1 | 2/2015 | Liu et al. |
| 9,236,292 | B2 | 1/2016 | Romero et al. |
| 9,324,650 | B2 | 4/2016 | Edelstein et al. |
| 9,362,165 | B1 * | 6/2016 | Bouche .............. H01L 23/5226 |
| 9,362,413 | B2 | 6/2016 | Yu et al. |
| 9,666,451 | B2 | 5/2017 | Wallace et al. |
| 2005/0167846 | A1 | 8/2005 | Aoyama |
| 2008/0160783 | A1 | 7/2008 | Watanabe et al. |
| 2009/0269569 | A1 | 10/2009 | Fucsko et al. |
| 2010/0301480 | A1 | 12/2010 | Choi et al. |
| 2011/0281417 | A1 | 11/2011 | Gordon et al. |
| 2013/0072019 | A1 | 3/2013 | Ryan |
| 2014/0029181 | A1 | 1/2014 | Gstrein |
| 2015/0132901 | A1 | 5/2015 | Wang et al. |
| 2015/0279736 | A1 | 10/2015 | Hotta et al. |
| 2015/0364420 | A1 * | 12/2015 | Lin .................... H01L 23/5283 257/775 |
| 2015/0371896 | A1 | 12/2015 | Chen et al. |
| 2016/0141416 | A1 | 5/2016 | Mariani et al. |
| 2016/0163587 | A1 | 6/2016 | Backes et al. |
| 2016/0163640 | A1 | 6/2016 | Edelstein et al. |
| 2016/0190009 | A1 | 6/2016 | Wallace et al. |
| 2018/0096847 | A1 | 4/2018 | Thompson et al. |

OTHER PUBLICATIONS

PCT International Search Report and Written Opinion in PCT/US2017/060367 dated Feb. 22, 2018, 9 pages.
PCT International Search Report and Written Opinion in PCT/US2018/026026, dated Jul. 26, 2018, 11 pages.

* cited by examiner

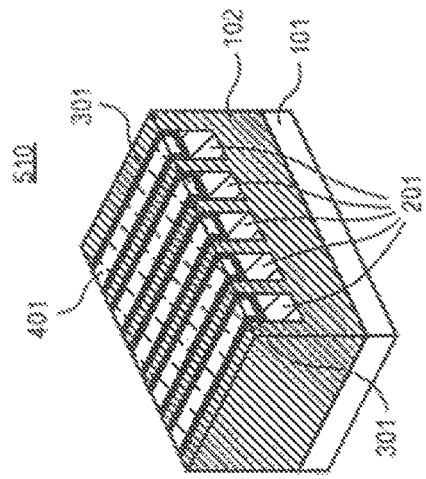
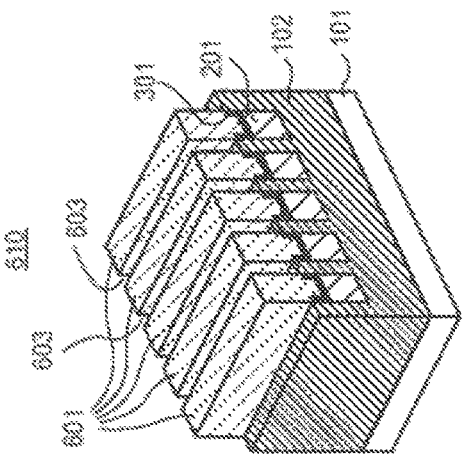
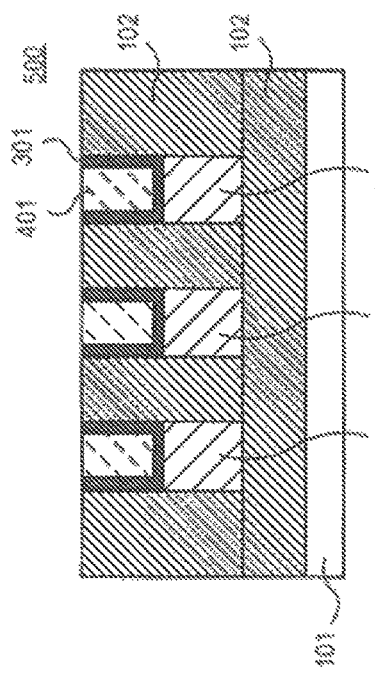
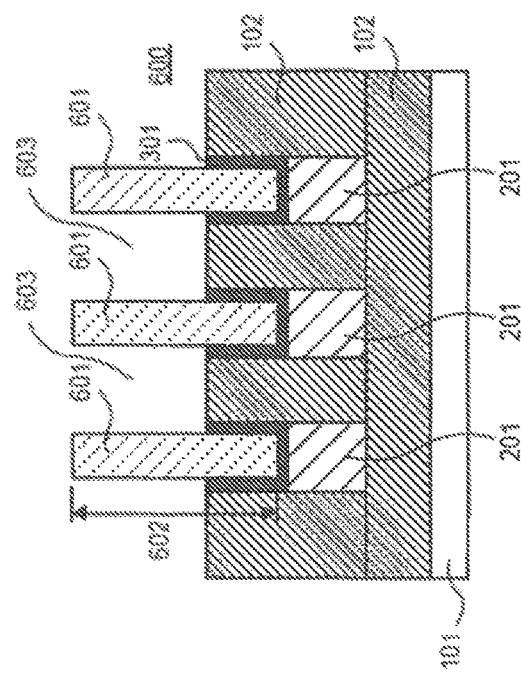

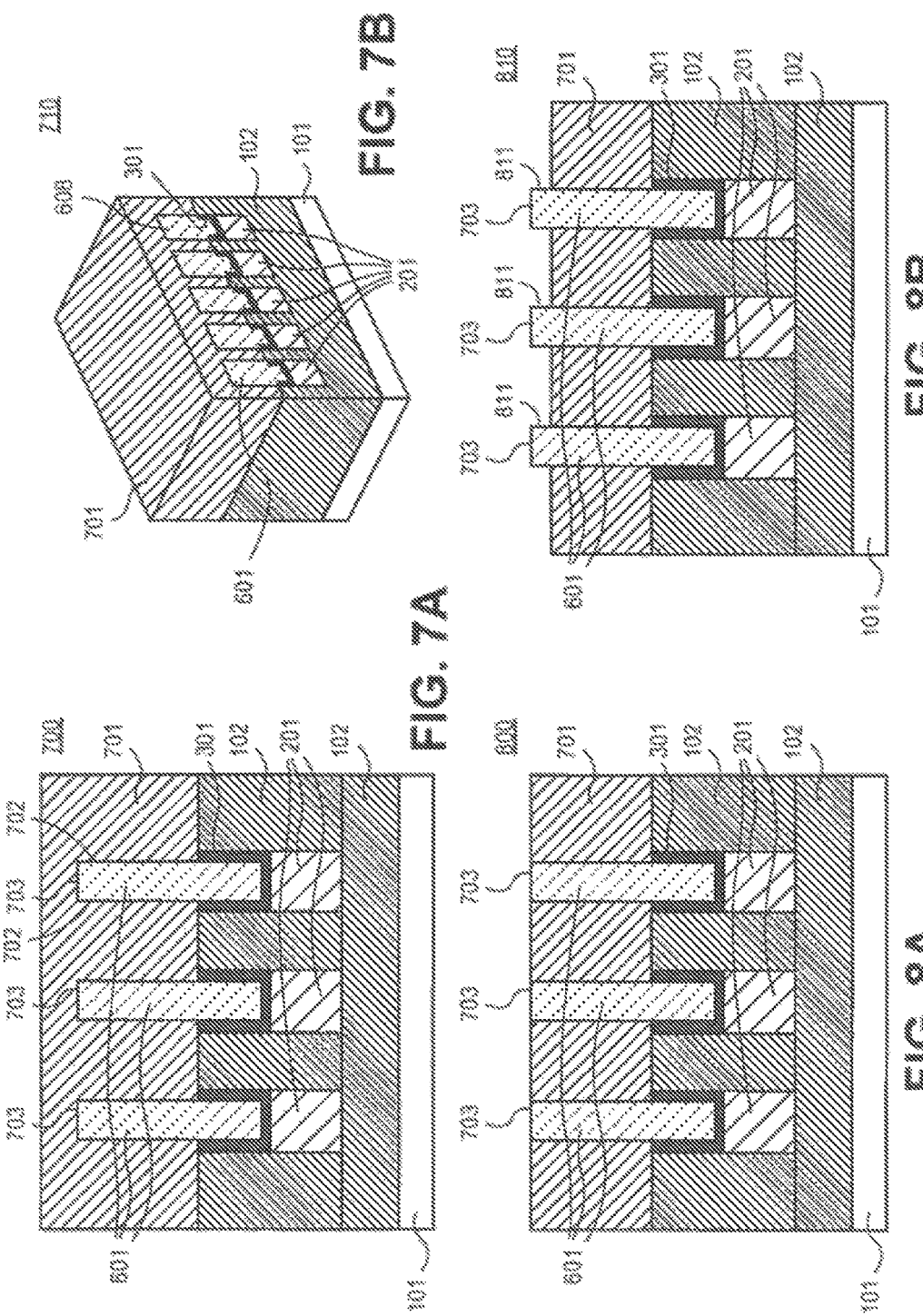

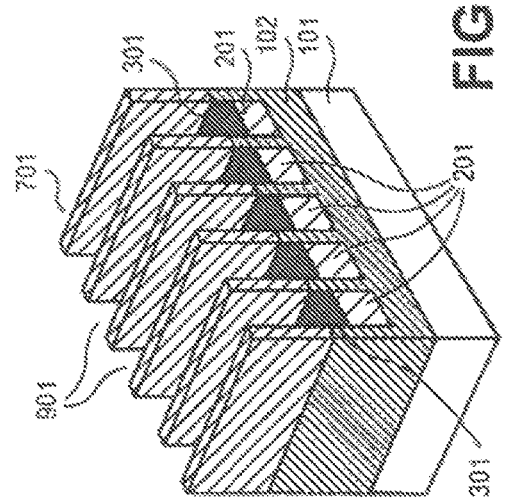
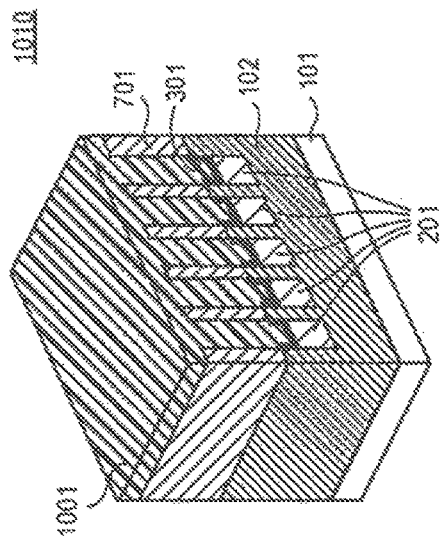
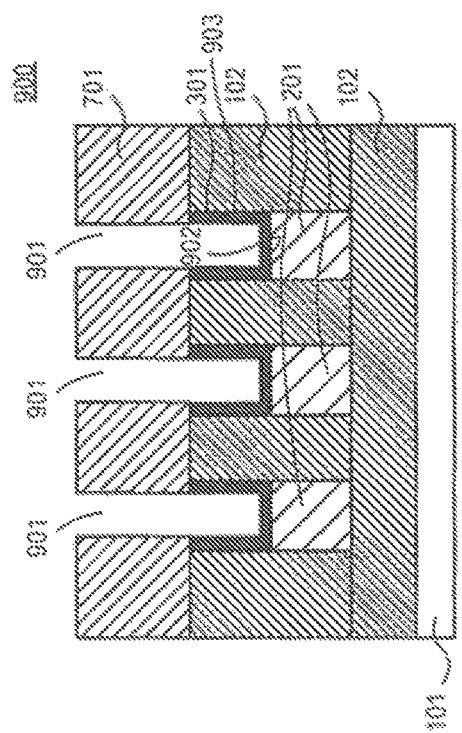
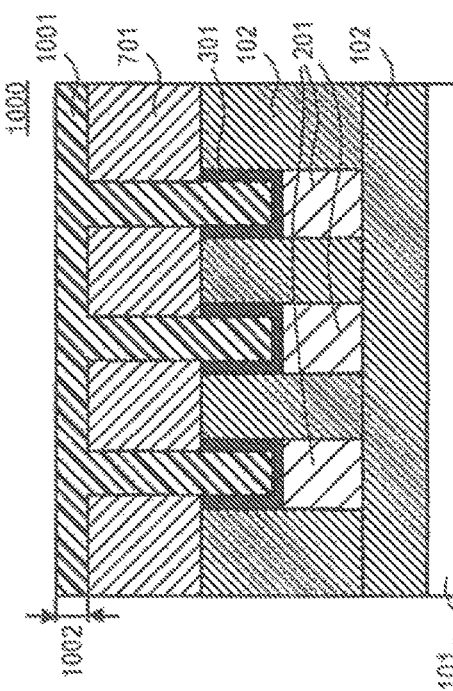

FULLY SELF-ALIGNED VIA

CROSS-REFERENCE TO RELATED APPLICATIONS

This application is a Divisional Application of U.S. application Ser. No. 15/679,458, filed on Aug. 17, 2017, which claims priority to U.S. Provisional Application No. 62/481,301, filed Apr. 4, 2017, the entire disclosures of which are hereby incorporated by reference herein.

TECHNICAL FIELD

Embodiments of the present disclosure pertain to the field of electronic device manufacturing, and in particular, to an integrated circuit (IC) manufacturing.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide the full via self-alignment. In the conventional techniques, the vias formed to connect lines in an upper metallization layer to a lower metallization are often misaligned to the lines in the lower metallization layer. The via-line misalignment increases via resistance and leads to potential shorting to the wrong metal line. The via-line misalignment causes device failures, decreases yield and increases manufacturing cost.

SUMMARY

Methods and apparatuses to provide full via self-alignment are described. In one embodiment, a first metallization layer comprises a set of first conductive lines that extend along a first direction on a first insulating layer on a substrate. A second insulating layer is on the first insulating layer. A second metallization layer comprises a set of second conductive lines on a third insulating layer and on the second insulating layer above the first metallization layer. The set of second conductive lines extend along a second direction that crosses the first direction at an angle. A via is between the first metallization layer and the second metallization layer. The via is self-aligned along the second direction to one of the first conductive lines.

In one embodiment, first conductive lines on a first insulating layer on a substrate are recessed. The first conductive lines extend along a first direction on the first insulating layer. Pillars are formed on the recessed first conductive lines. A second insulating layer is formed between the pillars. The pillars are removed to form trenches in the second insulating layer. A third insulating layer is deposited through the trenches onto the recessed first conductive lines. The third insulating layer is etched selectively relative to the second insulating layer to form a via opening down to one of the first conductive lines.

In one embodiment, a system to manufacture an electronic device comprises a processing chamber that comprises a pedestal to hold an electronic device structure. The electronic device structure comprises a first metallization layer that comprises a set of first conductive lines that extend along a first direction on a first insulating layer on a substrate. A plasma source is coupled to the processing chamber to generate plasma. A processor is coupled to the plasma source. The processor has a configuration to control recessing the first conductive lines. The processor has a configuration to control recessing the first conductive lines. The processor has a configuration to control forming pillars on the recessed first conductive lines. The processor has a configuration to control depositing a second insulating layer between the pillars. The processor has a configuration to control removing the pillars to form trenches in the second insulating layer. The processor has a configuration to control depositing a third insulating layer through the trenches onto the recessed first conductive lines. The processor has a sixth configuration to control etching the third insulating layer selectively relative to the second insulating layer to form a via opening down to one of the first conductive lines.

Other features of the present disclosure will be apparent from the accompanying drawings and from the detailed description which follows.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 5A is a view similar to FIG. 4, after portions of the seed gapfill layer are removed to expose top portions of the insulating layer according to one embodiment.

FIG. 5B is a perspective view of the electronic device structure shown in FIG. 5A.

FIG. 6A is a view similar to FIG. 5A, after self-aligned selective growth pillars are formed according to one embodiment.

FIG. 6B is a view similar to FIG. 5B, after self-aligned selective growth pillars are formed according to one embodiment.

FIG. 7A is a view similar to FIG. 6A after an insulating layer is deposited to overfill the gaps between the pillars according to one embodiment.

FIG. 7B is a view similar to FIG. 6B, after an insulating layer is deposited to overfill the gaps between the pillars according to one embodiment.

FIG. 8A is a view similar to FIG. 7A, after a portion of the insulating layer is removed to expose the top portions of the pillars according to one embodiment.

FIG. 8B is a view similar to FIG. 6A, after an insulating layer is deposited to underfill the gaps between the pillars according to another embodiment.

FIG. 9A is a view similar to FIG. 8A after the self-aligned selectively grown pillars are selectively removed to form trenches according to one embodiment.

FIG. 9B is a perspective view of the electronic device structure depicted in FIG. 9A.

FIG. 10A is a view similar to FIG. 9A after an insulating layer is deposited into trenches according to one embodiment.

FIG. 10B is a view similar to FIG. 9B after an insulating layer is deposited into trenches according to one embodiment.

DETAILED DESCRIPTION

Figure 1A:
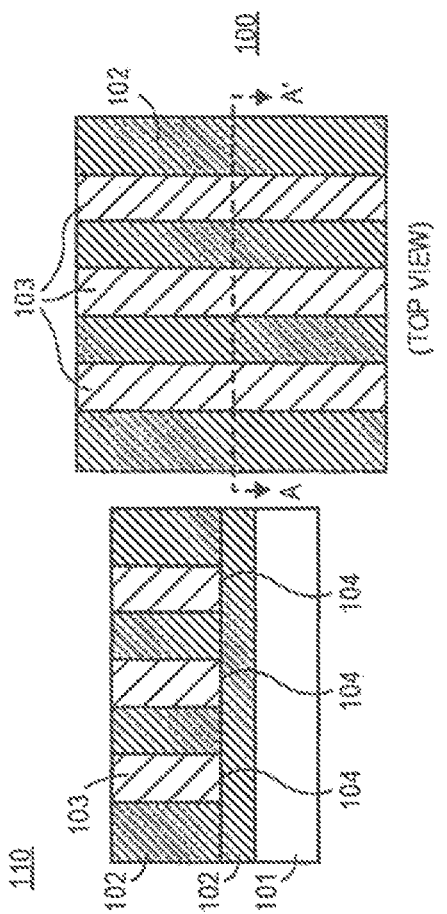
FIG. 1A illustrates a top view and a cross-sectional view of an electronic device structure to provide a fully self-aligned via according to one embodiment.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Methods and apparatus to provide fully self-aligned vias are described. In one embodiment, a first metallization layer comprising a set of first conductive lines extending along a first direction on a first insulating layer on a substrate is formed. A second insulating layer is formed on the first insulating layer. A second metallization layer comprising a set of second conductive lines on a third insulating layer above the first metallization layer is formed. The set of second conductive lines extend along a second direction. A via is formed between the first metallization layer and the second metallization layer. The via is self-aligned along the second direction to one of the first conductive lines. The via is self-aligned along the first direction to one of the second conductive lines, as described in further detail below. In one embodiment, the first and second directions cross each other at an angle. In one embodiment, the first direction and second direction are substantially orthogonal to each other.

In one embodiment, a fully self-aligned via is fabricated using a selective pillar growth technique. In one embodiment, the conductive lines on a first insulating layer on a substrate are recessed. The conductive lines extend along a first direction on the first insulating layer. Pillars are formed on the recessed conductive lines. A second insulating layer is deposited between the pillars. A third insulating layer is deposited on the second insulating layer. The third insulating layer is selectively etched relative to the second insulating layer to form a via opening down to one of the conductive lines, as described in further detail below.

In one embodiment, a fully self-aligned via is the via that is self-aligned along at least two directions to the conductive lines in a lower and an upper metallization layer. In one embodiment, the fully self-aligned via is defined by a hard mask in one direction and the underlying insulating layer in another direction, as described in further detail below.

Comparing to the conventional techniques, the embodiments to provide the fully self-aligned vias advantageously eliminate the via misalignment issues and avoid shortening to the wrong metal line. The fully self-aligned vias provide lower via resistance and capacitance benefits over the conventional vias. Embodiments of the self-aligned vias provide the full alignment between the vias and the conductive lines of the metallization layers that is substantially error free that advantageously increase the device yield and reduce the device cost.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure maybe practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Moreover, inventive aspects lie in less than all the features of a single disclosed embodiment of the disclosure. Thus, the claims following the Detailed Description are hereby expressly incorporated into this Detailed Description, with each claim standing on its own as a separate embodiment of this disclosure. While the disclosure has been described in terms of several embodiments, those skilled in the art will recognize that the disclosure if not limited to the embodiments described, but can be practiced with modification and alteration within the spirit and scope of the appended claims. The description is thus to be regarded as illustrative rather than limiting.

Figure 1B:
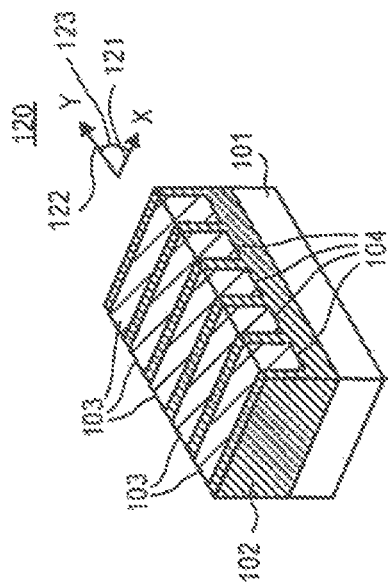
FIG. 1B is a perspective view of the electronic device structure depicted in FIG. 1A.

FIG. 1A illustrates a top view 100 and a cross-sectional view 110 of an electronic device structure to provide a fully self-aligned via according to one embodiment. The cross-sectional view 110 is along an axis A-A', as depicted in FIG. 1A. FIG. 1B is a perspective view 120 of the electronic device structure depicted in FIG. 1A. A lower metallization layer (Mx) comprises a set of conductive lines 103 that extend along an X axis (direction) 121 on an insulating layer 102 on a substrate 101, as shown in FIGS. 1A and 1B. As shown in FIG. 1B, X axis (direction) 121 crosses Y axis (direction) 122 at an angle 123. In one embodiment, angle 123 is about 90 degrees. In another embodiment, angle 123 is an angle that is other than the 90 degrees angle. The insulating layer 102 comprises trenches 104. The conductive lines 103 are deposited in trenches 104.

In an embodiment, the substrate 101 comprises a semiconductor material, e.g., silicon (Si), carbon (C), germanium (Ge), silicon germanium (SiGe), galloum arsenide (GaAs), InP, GaAs, InGaAs, InAlAs, other semiconductor material, or any combination thereof. In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate can be, e.g., an organic. A ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one embodiment, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate includes one or more buffer layers to accommodate for a lattice mismatch between the substrate 101 and one or more layers above substrate 101 and to confine lattice dislocations and defects.

Insulating layer 102 can be any material suitable to insulate adjacent devices and prevent leakage. In one embodiment, electrically insulating layer 102 is an oxide layer, e.g., silicon dioxide, or any other electrically insulating layer determined by an electronic device design. In one embodiment, insulating layer 102 comprises an interlayer dielectric (ILD). In one embodiment, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof.

In one embodiment, insulating layer 102 includes a dielectric material having a k-value less than 5. In one embodiment, insulating layer 102 includes a dielectric material having a k-value less than 2. In at least some embodiments, insulating layer 102 includes a nitride, oxide, a polymer, phosphosilicate glass, fluorosilicate (SiOF) glass, organosilicate glass (SiOCH), other electrically insulating layer determined by an electronic device design, or any combination thereof. In at least some embodiments, insulating layer 102 may include polyimide, epoxy, photodefinable materials, such as benzocyclobutene (BCB), and WPR-series materials, or spin-on-glass.

In one embodiment, insulating layer 102 is a low-k interlayer dielectric to isolate one metal line from other metal lines on substrate 101. In one embodiment, the thickness of the layer 102 is in an approximate range from about 10 nanometers (nm) to about 2 microns (µm).

In an embodiment, insulating layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one embodiment, the lower metallization layer Mx comprising conductive lines 103 (i.e., metal lines) is a part of a back end metallization of the electronic device. In one embodiment, the insulating layer 102 is patterned and etched using a hard mask to form trenches 104 using one or more patterning and etching techniques known to one of ordinary skill in the art of microelectronic device manufacturing. In one embodiment, the size of trenches in the insulating layer 102 is determined by the size of conductive lines formed later on in a process.

In one embodiment, forming the conductive lines 201 involves filling the trenches 104 with a layer of conductive material. In one embodiment, a base layer (not shown) is first deposited on the internal sidewalls and bottom of the trenches 104, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer 102. Additionally, the conductive barrier layer can be used to provide adhesion for the seed layer (e.g., copper).

In one embodiment, to form the base layer, the conductive barrier layer is deposited onto the sidewalls and bottom of the trenches 104, and then the seed layer is deposited on the conductive barrier layer. In another embodiment, the conductive base layer includes the seed layer that is directly deposited onto the sidewalls and bottom of the trenches 104. Each of the conductive barrier layer and seed layer may be deposited using any think film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper, is deposited onto the seed layer of base layer of copper, by an electroplating process. In one embodiment, the conductive layer is deposited into the trenches 104 using a damascene process known to one of ordinary skill in the art of microelectronic device manufacturing. In one embodiment, the conductive layer is deposited onto the seed layer in the trenches 104 using a selective deposition technique, such as but not limited to electroplating, electroless, A CVD, PVD, MBE, MOCVD, ALD, spin-on, or other deposition techniques know to one of ordinary skill in the art of microelectronic device manufacturing.

In one embodiment, the choice of a material for conductive layer for the conductive lines 103 determines the choice of a material for the seed layer. For example, if the material for the conductive lines 103 includes copper, the material for the seed layer also includes copper. In one embodiment, the conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vandium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

In alternative embodiments, examples of the conductive materials that may be used for the conductive lines 103 of the metallization layer Mx are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, portions of the conductive layer and the base layer are removed to even out top portions of the conductive lines 103 with top portions of the insulating layer 102 using a chemical-mechanical polishing ("CMP") technique known to one of ordinary skill in the art of microelectronic device manufacturing.

In one non-limiting example, the thickness of the conductive lines 103 is in an approximate range from about 15 nm to about 1000 nm. In one non-limiting example, the thickness of the conductive lines 103 is from about 20 nm to about 200 nm. In one non-limiting example, the width of the conductive lines 103 is in an approximate range from about 5 nm to about 500 nm. In one non-limiting example, the spacing (pitch) between the conductive lines 103 is from about 2 nm to about 500 nm. In more specific non-limiting example, the spacing (pitch) between the conductive lines 103 is from about 5 nm to about 50 nm.

In an embodiment, the lower metallization layer Mx is configured to connect to other metallization layers (not shown). In an embodiment, the metallization layer Mx is configured to provide electrical contact to electronic devices, e.g., transistor, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 2A:
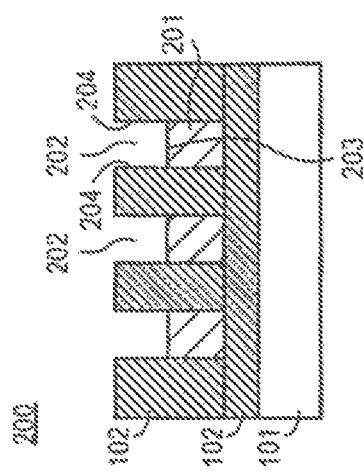
FIG. 2A is a view similar to FIG. 1A, after the conductive lines are recessed according to one embodiment.
Figure 2B:
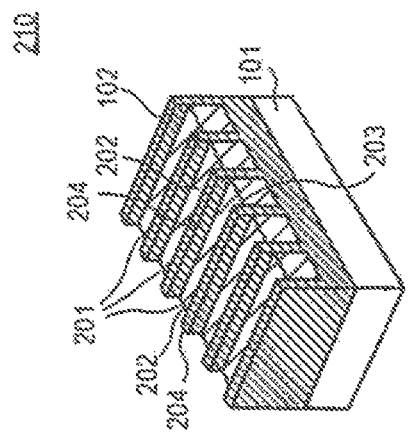
FIG. 2B is a view similar to FIG. 1B, after the conductive lines are recessed according to one embodiment.

FIG. 2A is a view 200 similar to view 110 of FIG. 1A, after the conductive lines 103 are recessed according to one embodiment. FIG. 2B is a view 210 similar to FIG. 1B, after the conductive lines 103 are recessed according to one embodiment. The conductive lines 103 are recessed to a predetermined depth to form recessed conductive lines 201. As shown in FIGS. 2A and 2B, trenches 202 are formed in the insulating layer 102. Each trench 202 has sidewalls 204 that are portions of insulating layer 102 and a bottom that is a top surface 203 of the recessed conductive line 201.

In one embodiment, the depth of the trenches 202 is from about 10 nm to about 500 nm. In one embodiment, the depth of the trenches 202 is from about 10% to about 100% of the thickness of the conductive lines. In one embodiment, the conductive lines 103 are recessed using one or more of wet etching, dry etching, or a combination thereof techniques known to one of ordinary skill in the art of electronic device manufacturing.

Figure 3:
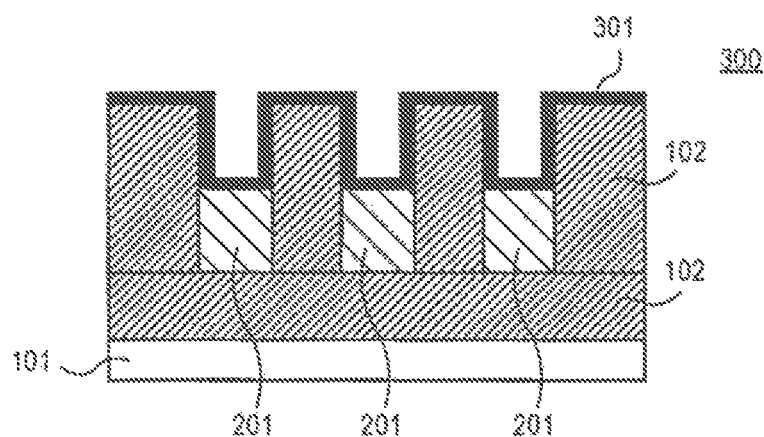
FIG. 3 is a view similar to FIG. 2A, after a liner is deposited on the recessed conductive lines according to one embodiment.

FIG. 3 is a view 300 similar to FIG. 2A, after a liner 301 is deposited on the recessed conductive lines 201 according to one embodiment. Liner 301 is deposited on the bottom and sidewalls of the trenches 202, as shown in FIG. 3.

In one embodiment, liner 301 is deposited to protect the conductive lines 201 from changing the properties later on in a process (e.g., during tungsten deposition, or other processes). In one embodiment, liner 301 is a conductive liner. In another embodiment, liner 301 is a non-conductive liner. In one embodiment, when liner 301 is a non-conductive liner, the liner 301 is removed later on in a process, as described in further detail below. In one embodiment, liner 301 includes titanium nitride (TiN), titanium (Ti), tantalum (Ta), tantalum nitride (TaN), or any combination thereof. In another embodiment, liner 301 is an oxide, e.g., aluminum oxide (AlO), titanium oxide ($TiO_2$). In yet another embodiment, liner 301 is a nitride, e.g., silicon nitride (SiN). In an embodiment, the liner 301 is deposited to the thickness from about 0.5 nm to about 10 nm.

In an embodiment, the liner 301 is deposited using an atomic layer deposition (ALD) technique. In one embodiment, the liner 301 is deposited using one of deposition techniques, such as but no limited to a CVD, PVD, MBE, MOCVD, spin-on, or other liner deposition techniques know to one of ordinary skill in the art of microelectronic device manufacturing.

Figure 4:
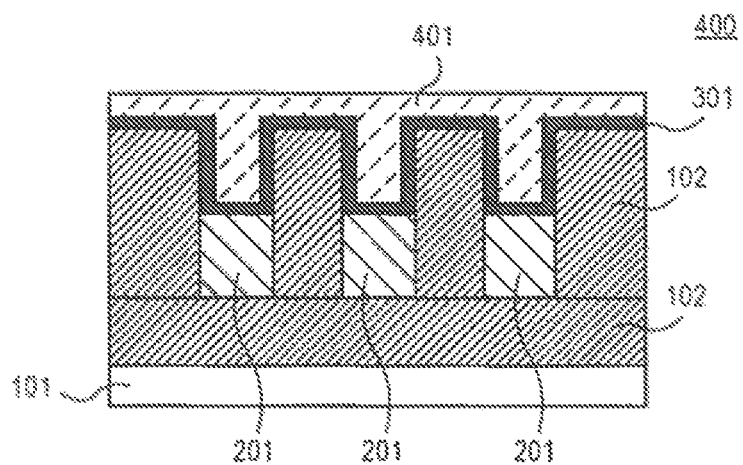
FIG. 4 is a view similar to FIG. 3, after a seed gapfill layer is deposited on the liner according to one embodiment.

FIG. 4 is a view 400 similar to FIG. 3, after a seed gapfill layer 401 is deposited on the liner 301 according to one embodiment. In one embodiment, seed gapfill layer 401 is a self-aligned selective growth seed film. As shown in FIG. 4, seed gapfill layer 401 is deposited on liner 301 on the top surface 203 of the recessed conductive lines 201, the sidewalls 204 of the trenches 202 and top portions of the insulating layer 102. In one embodiment, seed gapfill layer 401 is a tungsten (W) layer, or other seed gapfill layer to provide selective growth pillars. In some embodiments, seed gapfill layer 401 is a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, seed gapfill layer 401 comprises is a tungsten (W) seed gapfill layer.

In one embodiment, the seed gapfill layer 401 is deposited using one of deposition techniques, such as but not limited to an ALD, a CVD, PVD, MBE, MOCVD, spin-on or other liner deposition techniques known to one of ordinary skill in the art of microelectronic device manufacturing.

FIG. 5A is a view 500 similar to FIG. 4, after portions of the seed gapfill layer 401 are removed to expose top portions of the insulating layer 102 according to one embodiment. FIG. 5B is a perspective view of the electronic device structure shown in FIG. 5A. In one embodiment, the portions of the seed gapfill layer 401 are removed using one of the chemical-mechanical polishing (CMP) techniques known to one of ordinary skill in the art of microelectronic device manufacturing.

FIG. 6A is a view 600 similar to FIG. 5A, and FIG. 6B is a view 610 similar to FIG. 5B, after self-aligned selective growth pillars 601 are formed using the seed gapfill layer 401 on the liner 301 on the recessed conductive lines 201 according to one embodiment. As shown in FIGS. 6A and 6B, an array of the self-aligned selective growth pillars 601 has the same pattern as the set of the conductive lines 201. As shown in FIGS. 6A and 6B, the pillars 601 extend substantially orthogonally from the top surfaces of the conductive lines 201. As shown in FIGS. 6A and 6B, the pillars 601 extend along the same direction as the conductive lines 201. As shown in FIGS. 6A and 6B, the pillars are separated by gaps 603.

In one embodiment, the pillars 601 are selectively grown from the seed gapfill layer 401 on portions of the liner 301 on the conductive lines 201. The pillars 601 are not grown on portions of the liner 301 on the insulating layer 102, as shown in FIGS. 6A and 6B. In one embodiment, portions of the seed gapfill layer 401 above the conductive lines 201 are expanded for example, by oxidation, nitridation, or other process to grow pillars 601. In one embodiment, the seed gap fill layer 401 is oxidized by exposure to an oxidizing agent or oxidizing conditions to transform the metal or metal containing seed gapfill layer 401 to metal oxide pillars 601. In one embodiment, pillars 601 include an oxide of one or more metals listed above. In more specific embodiment, pillars 601 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In one embodiment, the pillars 601 are formed by oxidation of the seed gapfill layer at any suitable temperature depending on, for example, the composition of the seed gapfill layer and the oxidizing agent. In some embodiments, the oxidation occurs at a temperature in an approximate range of about 25 degrees C. to about 800 degrees C. In some embodiments, the oxidation occurs at a temperature greater than or equal to about 150° C.

In one embodiment, the height 602 of the pillars 601 is in an approximate range from about 5 angstroms (Å) to about 10 microns (μm).

FIG. 7A is a view 700 similar to FIG. 6A, and FIG. 7B is a view 710 similar to FIG. 6B, after an insulating layer 701 is deposited to overfill the gaps 603 between the pillars 601 according to one embodiment. As shown in FIGS. 7A and 7B, insulating layer 701 is deposited on the opposing sidewalls 702 and top portions 703 of the pillars 601 and through the gaps 603 on the portions of the insulating layer 102 and liner 301 between the pillars 601.

In one embodiment, insulating layer 701 is a low-k gapfill layer. In one embodiment, insulating layer 701 is a flowable silicon oxide (FSiOx) layer. In at least some embodiments, insulating layer 701 is an oxide layer, e.g., silicon dioxide, or any other electrically insulating layer determined by an electronic device design. In one embodiment, insulating layer 701 is an interlayer dielectric (ILD). In one embodiment, insulating layer 701 is a low-k dielectric that includes, but is not limited to, materials such as, e.g., silicon dioxide, silicon oxide, a carbon based material, e.g, a porous carbon film, carbon doped oxide ("CDO"), e.g., carbon doped silicon dioxide, porous silicon dioxide, porous silicon oxide carbide hydride (SiOCH), silicon nitride, or any combination thereof. In one embodiment, insulating layer 701 is a dielectric material having k-value less than 3. In more specific embodiment, insulating layer 701 is a dielectric material having k-value in an approximate range from about 2.2 to about 2.7. In one embodiment, insulating layer 701 includes a dielectric material having k-value less than 2. In one embodiment, insulating layer 701 represents one of the insulating layers described above with respect to insulating layer 102.

In one embodiment, insulating layer 701 is a low-k interlayer dielectric to isolate one metal line from other metal lines. In one embodiment, insulating layer 701 is deposited using one of deposition techniques, such as but not limited to a CVD, spin-on, an ALD, PVD. MBE, MOCVD, or other low-k insulating layer deposition techniques known to one of ordinary skill in the art of microelectronic device manufacturing.

FIG. 8A is a view 800 similar to FIG. 7A, after a portion of the insulating layer 701 is removed to expose the top portions 703 of the pillars 601 according to one embodiment. In one embodiment, the portion of the insulating layer 701 is removed using a CMP technique known to one of ordinary skill in the art of microelectronic device manufacturing. In one embodiment, the portion of the insulating layer 701 is etched back to expose the top portions 703 of the pillars 601 using one or more of the dry and wet etching techniques known to one of ordinary skill in the art of microelectronic device manufacturing.

FIG. 8B is a view 800 similar to FIG. 6A, after an insulating layer 701 is deposited to underfill (partially fill) the gaps 603 between the pillars 601 according to another embodiment. As shown in FIG. 8B, insulating layer 701 is deposited through gaps 603 on lower portions of opposing sidewalls 702 the pillars 601 and the portions of the insulating layer 102 and liner 301 between pillars 601. In one embodiment, insulating layer 701 is deposited to a predetermined thickness to expose the top portions 703 and upper portions of the opposing sidewalls 702 of the pillars 601.

In one embodiment, insulating layer 701 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing. In another embodiment, insulating layer 701 is deposited to overfill the gaps 603 between the pillars 601, as described with respect to FIG. 7A, and then a portion of the insulating layer 701 is etched back to expose upper portions 811 of the sidewalls 702 and top portions 703 of the pillars 601 using one or more of the dry and wet etching techniques known to one of ordinary skill in the art of microelectronic device manufacturing.

FIG. 9A is a view similar to FIG. 8A after the self-aligned selectively grown pillars 601 are selectively removed to form trenches 901 according to one embodiment. FIG. 9B is a perspective view of the electronic device structure depicted in FIG. 9A. As shown in FIGS. 9A and 9B, the pillars 601 are removed selectively to the insulating layer 701 and liner 301. In another embodiment, when liner 301 is a non-conductive liner, liner 301 is removed. In one embodiment, the pillars 601 and liner 301 are removed selectively to the insulating layers 701 and 102 and conductive lines 201. As shown in FIGS. 9A and 9B, trenches 901 are formed in the insulating layers 701 and 102. Trenches 901 extend along the recessed conductive lines 201. As shown in FIGS. 9A and 9B, each trench 901 has a bottom that is a bottom portion 902 of liner 301 and opposing sidewalls that include a sidewall portion 903 of liner 301 and a portion of insulating layer 701. In another embodiment, when liner 301 is removed, each trench 901 has a bottom that is recessed conductive line 201 and opposing sidewalls that include portions of insulating layers 701 and 102. Generally, the aspect ratio of the trench refers to the ratio of the depth of the trench to the width of the trench. In one embodiment, the aspect ratio of each trench 901 is in an approximate range from about 1:1 to about 200:1.

In one embodiment, the pillars 601 are selectively removed using one or more of the dry and wet etching techniques known to one of ordinary skill in the art of electronic device manufacturing. In one embodiment, the pillars 601 are selectively wet etched by e.g., 5 wt % of ammonium hydroxide ($NH_4OH$) aqueous solution at the temperature of about 80 degrees C. In one embodiment, hydrogen peroxide ($H_2O_2$) is added to the 5 wt % $NH_4OH$ aqueous solution to increase the etching rate of the pillars 601. In one embodiment, the pillars 601 are selectively wet etched using hydrofluoric acid (HF) and nitric acid ($HNO_3$) in a ratio of 1:1. In one embodiment, the pillars 601 are selectively wet etched using HF and $HNO_3$ in a ratio of 3:7 respectively. In one embodiment, the pillars 601 are selectively wet etched using HF and $HNO_3$ in a ratio of 4:1, respectively. In one embodiment, the pillars 601 are selectively wet etched using HF and $HNO_3$ in a ratio of 30%: 70%, respectively. In one embodiment, the pillars 601 including tungsten, titanium or both titanium and tungsten are selectively wet etched using $NH_4OH$ and $H_2O_2$ in a ratio of 1:2, respectively. In one embodiment, the pillars 601 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 601 are selectively wet etched using diluted or concentrated one or more of the chemistries including hydrochloric acid (HCl), $HNO_3$, surfuric acid ($H_2SO_4$), HF, and $H_2O_2$. In one embodiment, the pillars 601 are selectively wet etched using HF, $HNO_3$ and acetic acid (HAc) in a ratio of 4:4:3, respectively. In one embodiment, the pillars 601 are selectively dry etched using a bromotrifluoromethane (CBrF3) reactive ion etching (RIE) technique. In one embodiment, the pillar 601 are selectively dry etched using a chlorine, fluorine, bromine or any combination thereof based chemistries. In one embodiment, the pillars 601 are selectively wet etched using hot or warm Aqua Regia mixture including HCl and $HNO_3$ in a ratio of 3:1, respectively. In one embodiment, the pillars 601 are selectively etched using alkali with oxidizers (potassium nitrate ($KNO_3$) and lead dioxide ($PbO_2$)). In one embodiment, the liner 301 is selectively removed using one or more of the dry and wet etching techniques known to one of ordinary skill in the art of electronic device manufacturing.

FIG. 10A is a view 1000 and FIG. 10B is a view 1010 that are similar to FIGS. 9A and 9B respectively after an insulating layer 1001 is deposited into trenches 901 according to one embodiment. As shown in FIGS. 10A and 10B, insulating layer 1001 overfills the trenches 901 so that portions of the insulating layer 1001 are deposited on the top portions of the insulating layer 701. In one embodiment, the thickness of the insulating layer 1001 is greater or similar to the thickness of the insulating layer 701. In one embodiment, the thickness 1002 is at least two or three times greater than the thickness of the insulating layer 701. In another embodiment, the portions of the insulating layer 1001 are removed using one or more of the CMP or a back etch techniques to even out with the top portions of the insulating layer 701, and then other insulating layer (not shown) is deposited onto the top portions of the insulating layer 701 and insulating layer 1001. As shown in FIGS. 10A and 10B, insulating layer 1001 is deposited on the sidewalls and bottom of the trenches 901. As shown in FIGS. 10A and 10B, the insulating layer 1001 is deposited on the liner 301 and portions of the insulating layer 701. In another embodiment, when the liner 301 is removed, the insulating layer 1001 is directly deposited on the recessed lines 201 and portions of the insulating layer 102 and insulating layer 701. In one embodiment, the insulating layer 1001 is etch selective to the insulating layer 701. Generally, etch selectivity between two materials is defined as the ratio between their etching rates at similar etching conditions. In one embodiment, the ratio of the etching rate of the insulating layer 1001 to that of the insulating layer 701 is at least 5:1. In one embodiment, the ratio of the etching rates of the insulating layer 1001 to that of the insulating layer 701 is in an approximate range from about 2:1 to about 20:1.

In one embodiment, insulating layer 1001 is a low-k gapfill layer. In one embodiment, insulating layer 1001 is a flowable silicon oxide carbide (FSiOC) layer. In some other embodiments, insulating layer 1001 is an oxide layer, e.g., silicon dioxide, or any other electrically insulating layer determined by an electronic device design. In one embodiment, insulating layer 1001 is an interlayer dielectric (ILD). In one embodiment, insulating layer 1001 is a low-k dielectric that includes, but is not limited to, materials such as, e.g., silicon dioxide, silicon oxide, a carbon based material, e.g., a porous carbon film carbon doped oxide ("CDO"), e.g., carbon doped silicon dioxide, porous silicon dioxide, porous silicon oxide carbide hydride (SiOCH), silicon nitride, or any combination thereof. In one embodiment, insulating layer 1001 is a dielectric material having k-value less than 3. In more specific embodiment, insulating layer 1001 is a dielectric material having k-value in an approximate range from about 2.2 to about 2.7. In one embodiment, insulating layer 1001 includes a dielectric material having k-value less than 2. In one embodiment, insulating layer 1001 represents one of the insulating layers described above with respect to insulating layer 102 and insulating layer 701.

In one embodiment, insulating layer 1001 is a low-k interlayer dielectric to isolate one metal line from other metal lines. In one embodiment, insulating layer 1001 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

Figure 11:
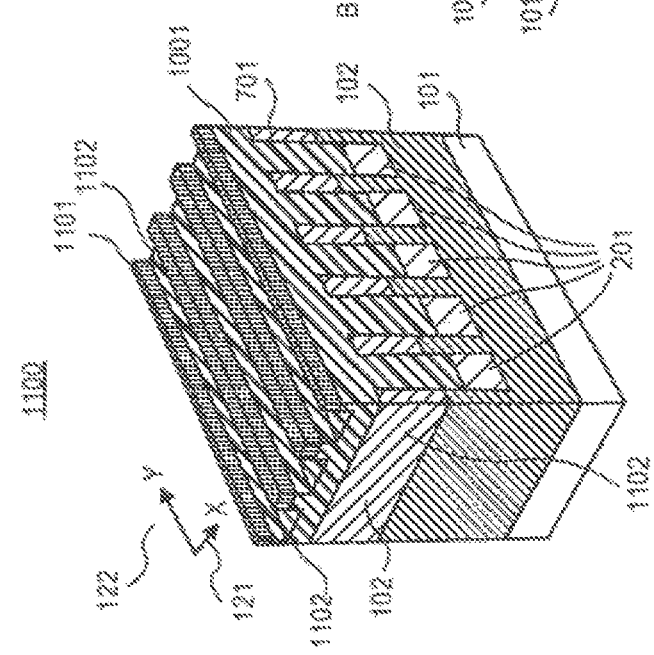
FIG. 11 is a view similar to FIG. 10B after a hard mask layer is deposited on an insulating layer according to one embodiment.

FIG. 11 is a view similar to FIG. 10B after a hard mask layer 1101 is deposited on insulating layer 1001 according to one embodiment. FIG. 11 is different from FIG. 10B in that the liner 301 is removed, so that insulating layer 1001 is directly deposited on the recessed lines 201 and portions of the insulating layer 102 and insulating layer 701, as described above. In one embodiment, hard mask layer 1101 is a metallization layer hard mask. As shown in FIG. 11, the hard mask layer 1101 is patterned to define a plurality of trenches 1102. As shown in FIG. 11, the trenches 1102 extend along an Y axis (direction) 122 that crosses an X axis (direction) 122 at an angle. In one embodiment, direction 122 is substantially perpendicular to direction 121. In one embodiment, patterned hard mask layer 1101 is a carbon hard mask layer, a metal oxide hard mask layer, a metal nitride hard mask layer, a silicon nitride hard mask layer, a silicon oxide hard mask layer, a carbide hard mask layer, or other hard mask layer known to one of ordinary skill in the art of microelectronic device manufacturing. In one embodiment, the patterned hard mask layer 1101 is formed using one or more hard mask patterning techniques known to one of ordinary skill in the art of microelectronic device manufacturing. In one embodiment, the insulating layer 1001 is etched through a patterned hard mask layer to form trenches 104 using one or more of etching techniques known to one of ordinary skill in the art of microelectronic device manufacturing. In one embodiment, the size of trenches in the insulating layer 1001 is determined by the size of conductive lines formed later on in a process.

Figure 12B:
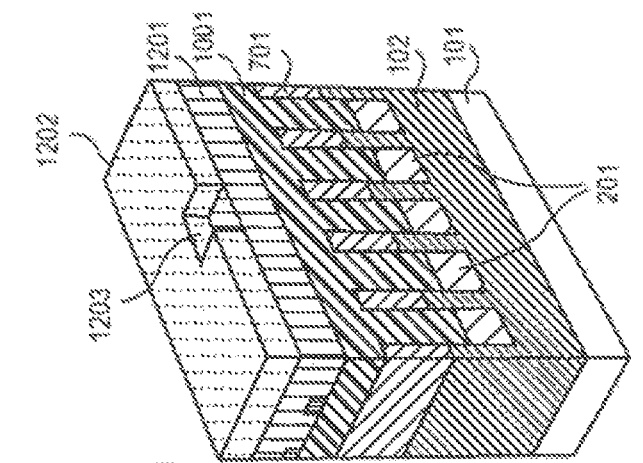
FIG. 12B is a cross-sectional view of FIG. 12A along an axis B-B'.
Figure 12A:
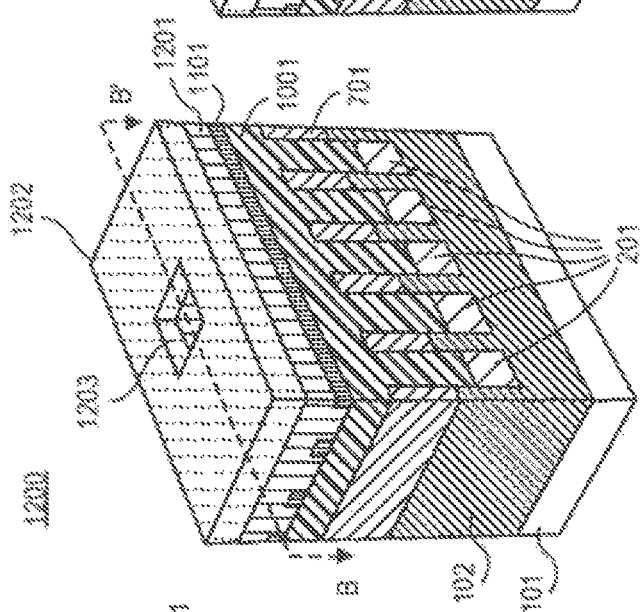
FIG. 12A is a view similar to FIG. 11 after a mask layer is deposited on an insulating layer on the patterned hard mask layer according to one embodiment.

FIG. 12A is a view similar to FIG. 11, after a mask layer 1202 is deposited on an insulating layer 1201 on a patterned hard mask layer 1101 according to one embodiment. FIG. 12B is a cross-sectional view of FIG. 12A along an axis B-B'.

As shown in FIGS. 12A and 12B, an opening 1203 is formed in mask layer 1202. Opening 1203 is formed above one of the conductive lines 201, as shown in FIGS. 12A and 12B. In one embodiment, the opening 1203 defines a trench portion of the fully self-aligned via formed later on in a process.

In one embodiment, mask layer 1202 includes a photoresist layer. In one embodiment, mask layer 1202 includes one or more hard mask layers. In one embodiment, the insulating layer 1201 is a hard mask layer. In one embodiment, insulating layer 1201 includes a bottom anti-reflective coating (BARC) layer. In one embodiment, insulating layer 1201 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer, or any combination thereof. In one embodiment, insulating layer 1201 represents one of the insulating layers described above. In one embodiment, mask layer 1202 is deposited using one or more mask layer deposition techniques known to one of ordinary skill in the art of microelectronic device manufacturing. In one embodiment, insulating layer 1201 is deposited using one of deposition techniques, such as but not limited to a CVD, PVD, MBE, NOCVD, spin-on, or other insulating layer deposition techniques known to one of ordinary skill in the art of microelectronic device manufacturing. In one embodiment, the opening 1203 is formed using one or more of the patterning and etching techniques known to one of ordinary skill in the art of microelectronic device manufacturing.

Figure 13A:
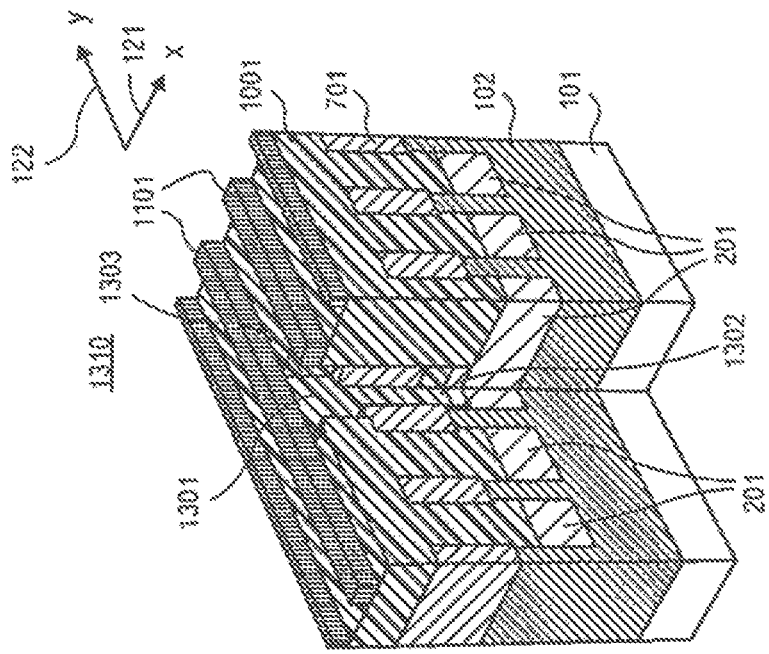
FIG. 13A is a view similar to FIG. 12B after the insulating layer is selectively etched according to one embodiment.
Figure 13B:
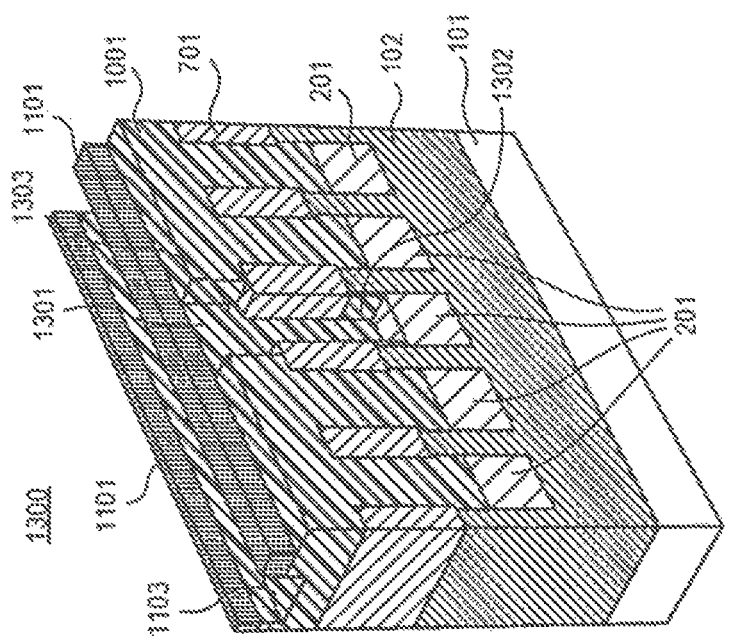
FIG. 13B is a view similar to FIG. 12A after the insulating layer is selectively etched according to one embodiment.

FIG. 13A is a view 1300 similar to FIG. 12B after the insulating layer 1201 and insulating layer 1101 are selectively etched through opening 1203 to form an opening 1301 according to one embodiment. FIG. 13B is a view 1310 similar to FIG. 12A after the insulating layer 1201 and insulating layer 1001 are selectively etched through opening 1203 to form opening 1301 according to one embodiment. FIG. 13B is different from FIG. 12A in that FIG. 13B shows a cut through opening 1301 along X axis 121 and Y axis 122. As shown in FIGS. 13A and 13B, opening 1301 includes a via portion 1302 and a trench portion 1303. As shown in FIGS. 13A and 13B, via portion 1302 of the opening 1301 is limited along Y axis 122 by insulating layer 701. Via portion 1302 of the opening 1301 is self-aligned along Y axis to one of the conductive lines 201. As shown in FIGS. 13A and 13B, trench portion 1303 is limited along X axis 121 by the features of the hard mask layer 1101 that extend along Y axis 122. In one embodiment, insulating layer 1001 is selectively etched relative to the insulating layer 701 to form opening 1301.

In one embodiment, insulating layer 1201 is selectively etched relative to the insulating layer 701 to form opening 1301. As shown in FIGS. 13A and 13B, mask layer 1202 and insulating layer 1201 are removed. In one embodiment, mask layer 1202 is removed using one or more of the mask layer removal techniques known to one of ordinary skill in the art of microelectronic device manufacturing. In one embodiment, insulating layer 1201 is removed using one or more of the etching techniques known to one of ordinary skill in the art of microelectronic device manufacturing.

Figure 14A:
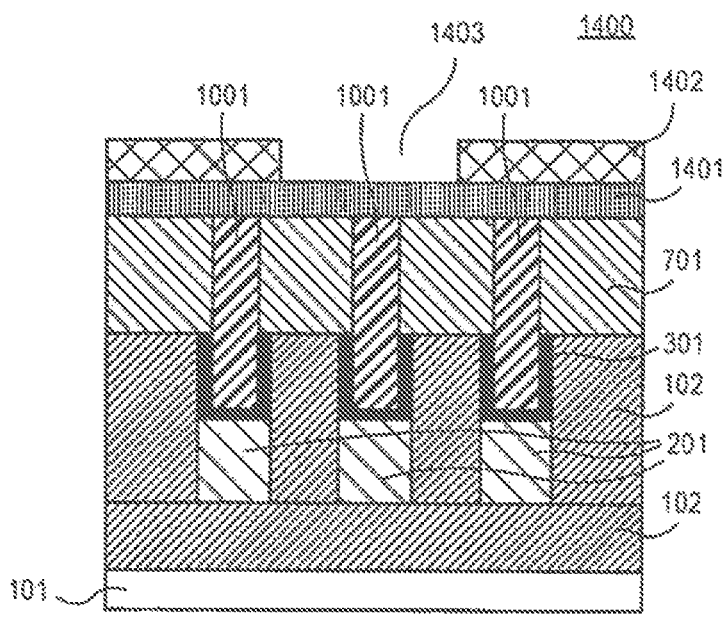
FIG. 14A is a view similar to FIG. 10A after a mask layer is deposited on a hard mask layer according to one embodiment.
Figure 14B:
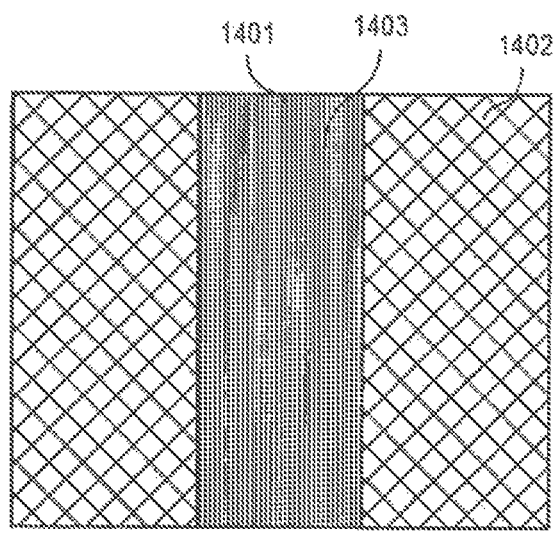
FIG. 14B is a top view of the electronic device structure depicted in FIG. 14A.

FIG. 14A is a view 1400 similar to FIG. 10A, after a mask layer 1402 is deposited on a hard mask layer 1401 on the exposed insulating layer 701 and insulating layer 1001 according to one embodiment. FIG. 14B is a top view 1410 of the electronic device structure depicted in FIG. 14A. As shown in FIG. 14A, a portion of the insulating layer 1001 is removed to even out top portions of the insulating layer 701 with top portions of the insulating layer 1001. As shown in FIGS. 14A and 14B, mask layer 1402 has an opening 1403 to expose hard mask layer 1401.

In one embodiment, the portion of the insulating layer 1001 is removed using a CMP technique known to one of ordinary skill in the art of microelectronic device manufacturing. In one embodiment, a portion of the insulating layer 1001 is etched back to expose the top portion of the insulating layer 701. In another embodiment, a portion of the insulating layer 701 is etched back to a predetermined depth to expose upper portions of the sidewalls and top portions of the insulating layer 1001 in the trenches 901. In one embodiment, the portion of the insulating layer 701 is etched back using one or more of the dry and wet etching techniques known to one of ordinary skill in the art of microelectronic device manufacturing.

In one embodiment, mask layer 1402 includes a photoresist layer. In one embodiment, mask layer 1402 includes one or more hard mask layers. In one embodiment, mask layer 1402 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In one embodiment, the hard mask layer 1401 is a metallization layer hard mask to pattern the conductive lines of the next metallization layer. In one embodiment, hard mask layer 1401 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer or any combination thereof. In one embodiment, hard mask layer 1401 represents one of the hard mask layers described above.

In one embodiment, the insulating layer 701 and the insulating layer 1001 are patterned and etched using hard mask 1401 to form trenches using one or more patterning and etching techniques known to one or ordinary skill in the art of microelectronic device manufacturing. In one embodiment, the size of trenches in the insulating layer 701 and insulating layer 1001 is determined by the size of conductive lines formed later on in a process.

In one embodiment, the mask layer 1402 is deposited using one or more of the mask deposition techniques known to one of ordinary skill in the art of microelectronic device manufacturing. In one embodiment, hard mask layer 1401 is deposited using one or more hard mask layer deposition techniques, such as but not limited to a CVD, PVD, MBE, MOCVD, spin-on, or other hard mask deposition known to one of ordinary skill in the art of microelectronic device manufacturing. In one embodiment, the opening 1403 is formed using one or more of the patterning and etching techniques known to one of ordinary skill in the art of microelectronic device manufacturing.

Figure 15A:
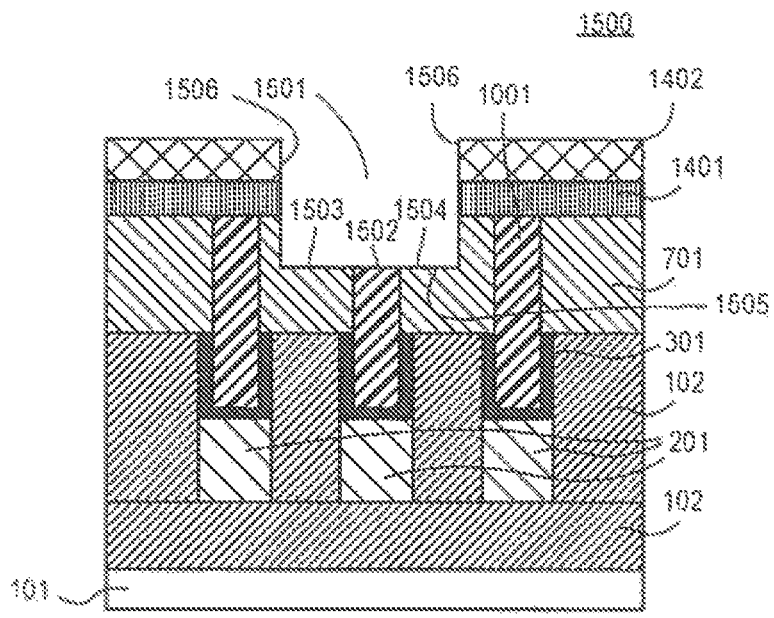
FIG. 15A is a view similar to FIG. 14A after portions of the hard mask layer and the insulating layer are removed according to one embodiment.
Figure 15B:
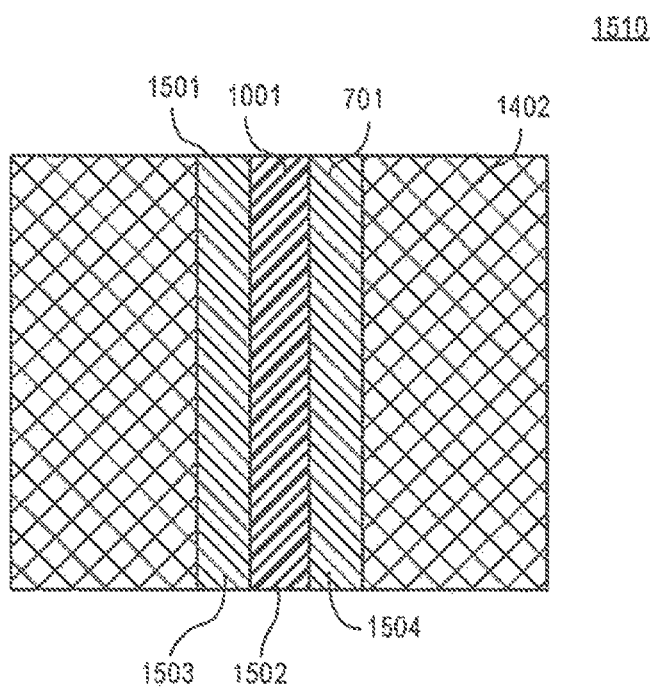
FIG. 15B is a top view of the electronic device structure depicted in FIG. 15A.

FIG. 15A is a view 1500 similar to FIG. 14A, after portions of the hard mask layer 1401, insulating layer 701 and insulating layer 1001 are removed through opening 1403 to form an opening 1501 in insulating layer 701 according to one embodiment. FIG. 15B is a top view 1510 of the electronic device structure depicted in FIG. 15A. In one embodiment, opening 1501 is a trench opening for a via. As shown in FIGS. 15A and 15B, opening 1501 includes a bottom 1505 that includes a portion 1502 of the insulating layer 1001 between portions 1503 and 1504 of the insulating layer 701. As shown in FIGS. 15A and 15B, opening 1501 includes opposing sidewalls 1506 that include portions of the insulating layer 701. In one embodiment, each sidewall 1506 is substantially orthogonal to bottom 1505. In another embodiment, each sidewall 1506 is slanted relative to bottom 1505 at an angle other than 90 degrees, so that an upper portion of the opening 1501 is greater than a lower portion of the opening 1501.

In one embodiment, opening 1501 having slanted sidewalls is formed using an angled non-selective etch. In one embodiment, hard mask layer 1401 is removed using one or more of wet etching, dry etching, or a combination thereof techniques known to one of ordinary skill in the art of microelectronic device manufacturing. In one embodiment, insulating layer 701 and insulating layer 1001 are removed using a non-selective etch in a trench first dual damascene process. In one embodiment, insulating layer 701 and insulating layer 1001 are etched down to the depth that is determined by time. In another embodiment, insulating layer 701 and insulating layer 1001 are etched non-selectively down to an etch stop layer (not shown). In one embodiment, insulating layer 701 and insulating layer 1001 are non-selectively etched using one or more of wet etching, dry etching, or a combination thereof techniques known to one of ordinary skill in the art of electronic device manufacturing.

Figure 16A:
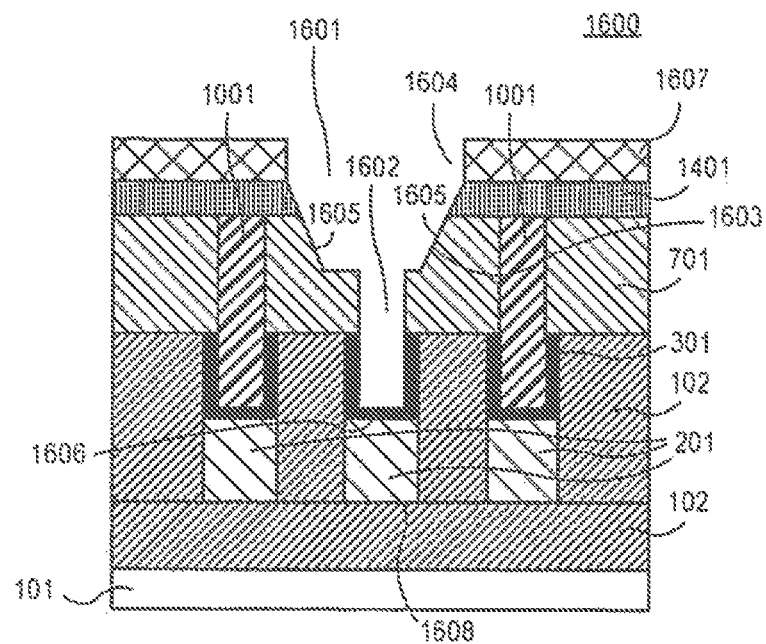
FIG. 16A is a view similar to FIG. 15A after a fully self-aligned opening is formed in insulating layer according to one embodiment.
Figure 16B:
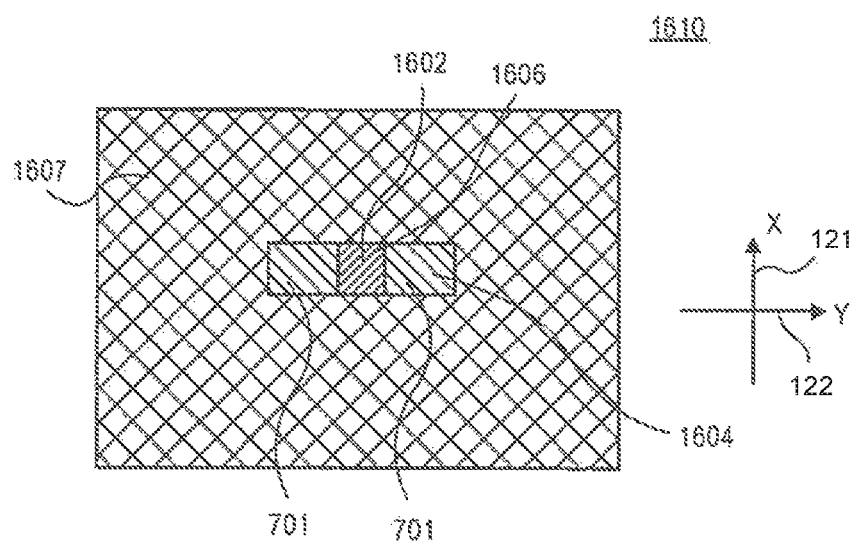
FIG. 16B is a top view of the electronic device structure depicted in FIG. 16A.

FIG. 16A is a view 1600 similar to FIG. 15A, after a fully self-aligned opening 1601 is formed in insulating layer 701 according to one embodiment. FIG. 16B is a top view 1610 of the electronic device structure depicted in FIG. 16A. As shown in FIGS. 16A and 16B, mask layer 1402 is removed. Mask layer 1402 can be removed using one of the mask layer removal techniques known to one of ordinary skill in the art of microelectronic device manufacturing. A patterned mask layer 1607 is formed on hard mask layer 1401. As shown in FIG. 16B, patterned mask layer 1607 is deposited on the hard mask layer 1401 and into opening 1501. Patterned mask layer 1607 has an opening 1604. Patterned mask layer 1607 can be formed using one or more of the mask layer depositing, patterning and etching techniques known to one of ordinary skill in the art of microelectronic device manufacturing.

Fully self-aligned opening 1601 is formed through mask opening 1604. Fully self-aligned opening 1601 includes a trench opening 1603 and a via opening 1602, as shown in FIGS. 16A and 16B. Via opening 1602 is underneath trench opening 1603. In one embodiment, trench opening 1603 is the part of the that is exposed through opening 1604.

In one embodiment, via opening 1602 is formed by selectively etching insulating layer 1001 relative to the insulating layer 701 through mask opening 1604 and trench opening 1603. In one embodiment, trench opening 1603 extends along Y axis 122. As shown in FIG. 16B, trench opening 1603 is greater along Y axis 122 than along X axis 121.

In one embodiment, trench opening 1603 of the opening 1601 is self-aligned along X-axis 121 between the features of the hard mask layer 1401 that are used to pattern the upper metallization layer conductive lines that extend along Y axis 122 (not shown). The via opening 1602 of the opening 1601 is self-aligned along Y-axis 122 by the insulating layer 701 that is left intact by selectively etching the portion 1502 of the insulating layer 1001 relative to the insulating layer 701. This provides an advantage as the size of the trench opening 1603 does not need to be limited to the size of the cross-section between the conductive line 1608 and one of the conductive lines of the upper metallization layer that provides more flexibility for the lithography equipment. As the portion 1502 is selectively removed relative to the insulating layer 701, the size of the trench opening increases.

As shown in FIGS. 15A and 15B, the portion 1502 is self-aligned with a conductive line 1608 that is one of the lower metallization layer conductive lines 201. That is, the opening 1601 is self-aligned along both X and Y axes.

FIG. 16A is different from FIG. 15A in that FIG. 16A illustrates trench opening 1603 having slanted sidewalls 1605. Each sidewall 1605 is at an angle other than 90 degrees to the top surface of the substrate 101, so that an upper portion of the trench opening 1603 is greater than a lower portion of the trench opening 1603. In another embodiment, the sidewalls 1605 are substantially orthogonal to the top surface of the substrate 101.

In one embodiment, mask layer 1607 includes a photoresist layer. In one embodiment, mask layer 1607 includes one or more hard mask layers. In one embodiment, mask layer 1607 is tri-layer mask stack, e.g., a 193i or EUV resist mask on a ML (e.g., a silicon containing organic layer or a metal containing dielectric layer) on a BARC layer on a silicon oxide hard mask. As shown in FIGS. 16A and 16B, via opening 1602 exposes a portion 1606 of the liner 301 on conductive line 1608. In another embodiment, when the liner 301 is removed, the via opening 1602 exposes conductive line 1608.

Figure 17A:
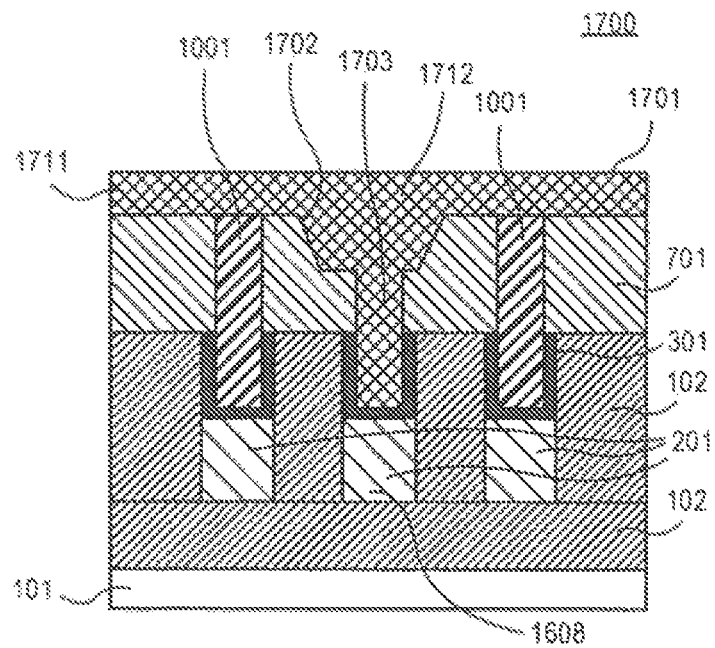
FIG. 17A is a view similar to FIG. 16A after an upper metallization layer comprising conductive lines extending along a Y axis is formed according to one embodiment.
Figure 17B:
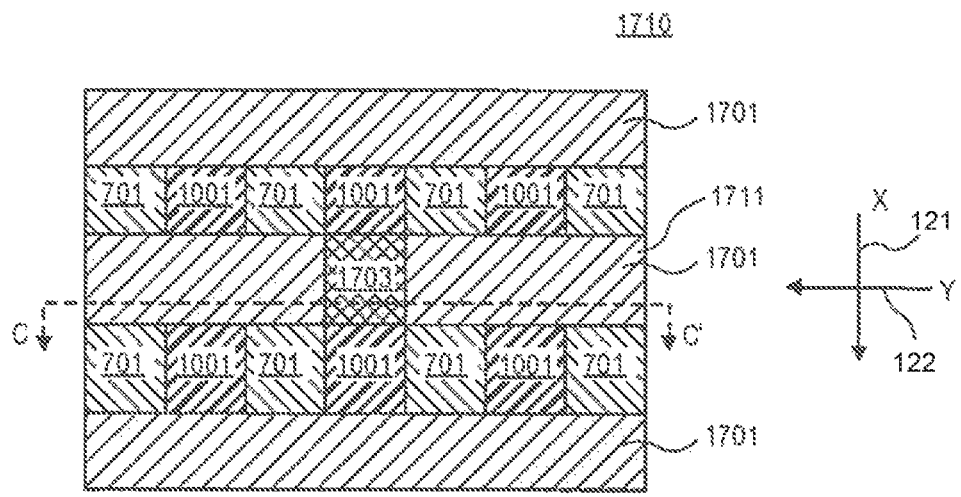
FIG. 17B is a top view of the electronic device structure depicted in FIG. 17A.

FIG. 17A is a view 1700 similar to FIG. 16A, after an upper metallization layer My comprising conductive lines extending along Y axis 122 is formed according to one embodiment. FIG. 17B is a top view 1710 of the electronic device structure depicted in FIG. 17A. FIG. 17A is a cross-sectional view of FIG. 17B along an axis C-C'. As shown in FIG. 17A, mask layer 1402 and hard mask layer 1401 are removed. In one embodiment, each of the mask layer 1402 and hard mask layer 1401 is removed using one or more of the hard mask layer removal techniques know in one of ordinary skill in the art of microelectronic device manufacturing.

An upper metallization layer My includes a set of conductive lines 1701 that extend on portions of insulating layer 1001 and portions insulating layer 701. As shown in FIG. 17B, the portions of the insulating layer 1001 are between the portions of the insulating layer 701. Conductive lines 1701 extend along Y axis 122. A fully self-aligned via 1712 includes a trench portion 1702 and a via portion 1703. Via portion 1703 is underneath trench portion 1702. The fully self-aligned via 1712 is between the lower metallization layer comprising conductive lines 201 that extend along X axis 121 and the upper metallization layer comprising conductive lines 1701. As shown in FIGS. 17A and 17B, the via portion 1703 is on liner 301 on conductive line 1608. As shown in FIGS. 17A and 17B, the via portion 1703 of the via 1712 is self-aligned along the Y axis 122 to conductive line 1608 that is one of the conductive lines 201. The via portion 1703 of the via 1712 is self-aligned along the X axis (direction) 121 to a conductive line 1711 that is one of the conductive lines 1701. In one embodiment, when liner 301 is removed, the via portion 1703 is directly on conductive line 1608. As shown in FIGS. 17A and 17B, the via portion 1703 is a part of the conductive line 1711. As shown in FIGS. 17A and 17B, the size of the via portion 1703 is determined by the size of the cross-section between the conductive line 1608 and conductive line 1711.

In one embodiment, forming the conductive lines 1701 and via 1712 involves filling the trenches in the insulating layer and the opening 1601 with a layer of conductive material. In one embodiment, a base layer (not shown) is first deposited on the internal sidewalls and bottom of the trenches and the opening 1601, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g, copper).

In one embodiment, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper, is deposited onto the seed layer of base later of copper, by an electroplating process. In one embodiment, the conductive layer is deposited into the trenches using a damascene process known to one of ordinary skill in the art of microelectronic device manufacturing. In one embodiment, the conductive layer is deposited onto the seed layer in the trenches and in the opening 1601 using a selective deposition technique, such as but not limited to electroplating, electroless, a CVD, PVD, MBE, MOCVD, ALD, spin-on, or other deposition techniques known to one of ordinary skill in the art of microelectronic device manufacturing.

In one embodiment, the choice of a material for conductive layer for the conductive lines 1701 and via 1712 determines the choice of a material for the seed layer. For example, if the material for the conductive lines 1701 and via 1712 includes copper, the material for the seed layer also includes copper. In one embodiment, the conductive lines 1701 and via 1712 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 1701 and via 1712 are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, portions of the conductive layer and the base layer are removed to even out top portions of the conductive lines 1701 with top portions of the insulating layer 701 and insulating layer 1001 using a chemical-mechanical polishing ("CMP") technique known to one of ordinary skill in the art of microelectronic device manufacturing.

In one non-limiting example, the thickness of the conductive lines 1701 is in an approximate range from about 15 nm to about 1000 nm. In one non-limiting example, the thickness of the conductive lines 1701 is from about 20 nm to about 200 nm. In one non-limiting example, the width of the conductive lines 1701 is in an approximate range from about 5 nm to about 500 nm. In one non-limiting example, the spacing (pitch) between the conductive lines 1701 is from about 2 nm to about 500 nm. In more specific non-limiting example, the spacing (pitch) between the conductive lines 1701 is from about 5 nm to about 50 nm.

FIGS. 18 through 22 (including both A and B designations) illustrate another embodiment of the disclosure. FIG. 18A is a view 1800 similar to FIG. 10A, after a mask layer 1802 is deposited on a hard mask layer 1801 on the insulating layer 1001 according to one embodiment. FIG. 18B is a top view 1810 of the electronic device structure depicted in FIG. 18A. As shown in FIGS. 18A and 18B, mask layer 1802 has an opening 1803 to expose hard mask layer 1801.

In one embodiment, mask layer 1802 includes a photoresist layer. In one embodiment, mask layer 1802 includes one or more hard mask layers. In one embodiment, mask layer 1802 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In one embodiment, the hard mask layer 1801 is a metallization layer hard mask to pattern the conductive lines of the next metallization layer. In one embodiment, hard mask layer 1801 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer or any combination thereof. In one embodiment, hard mask layer 1801 represents one of the hard mask layers described above.

In one embodiment, the mask layer 1802 is deposited using one or more of the mask deposition techniques known to one of ordinary skill in the art of microelectronic device manufacturing. In one embodiment, hard mask layer 1801 is deposited using one or more hard mask layer deposition techniques, such as but not limited to a CVD, PVD, MBE, MOCVD, spin-on, or other hard mask deposition known to one of ordinary skill in the art of microelectronic device manufacturing. In one embodiment, the opening 1803 is formed using one or more of the patterning and etching techniques known to one of ordinary skill in the art of microelectronic device manufacturing.

Figure 18A:
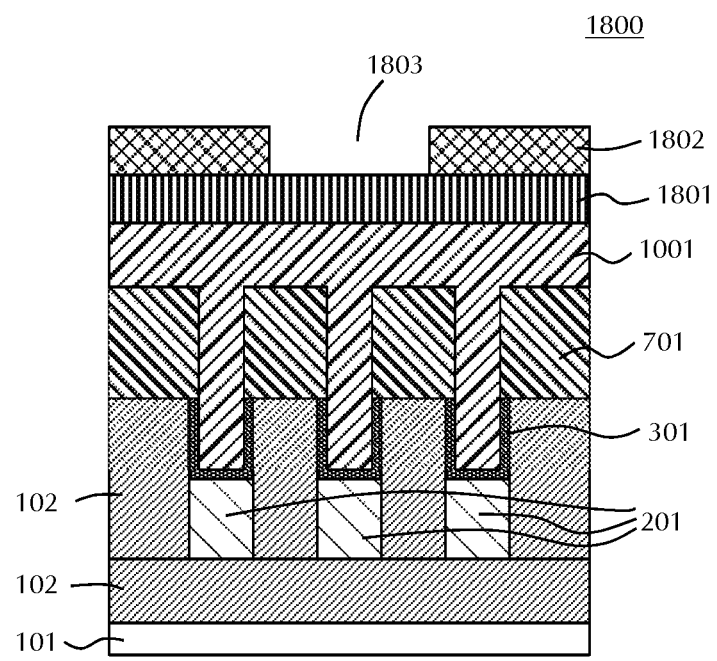
FIG. 18A is a view similar to FIG. 10A after a mask layer is deposited on a hard mask layer according to one embodiment.
Figure 18B:
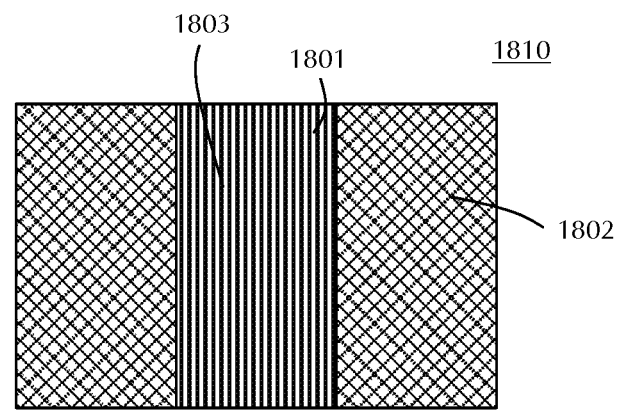
FIG. 18B is a top view of the electronic device structure depicted in FIG. 18A.
Figure 19A:
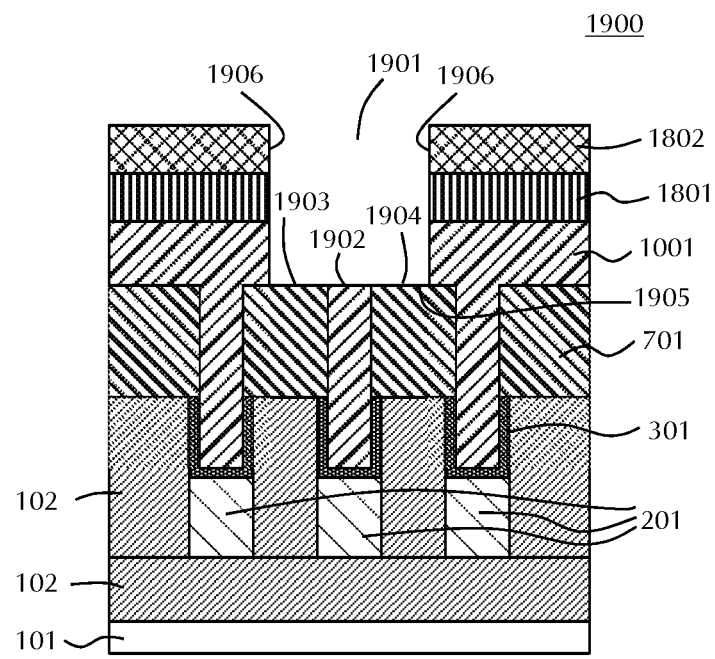
FIG. 19A is a view similar to FIG. 18A after portions of the hard mask layer and the insulating layer are removed according to one embodiment.
Figure 19B:
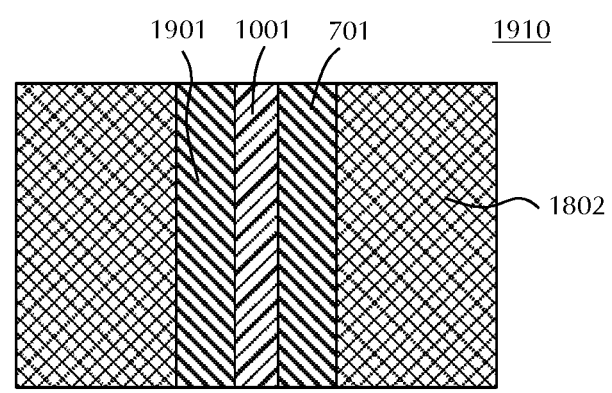
FIG. 19B is a top view of the electronic device structure depicted in FIG. 19A.

FIG. 19A is a view 1900 similar to FIG. 18A, after portions of the hard mask layer 1801 and insulating layer 1001 are removed through opening 1803 to form an opening 1901 in insulating layer 1001 according to one embodiment. FIG. 19B is a top view 1910 of the electronic device structure depicted in FIG. 19A. In one embodiment, opening 1901 is a trench opening for a via. As shown in FIGS. 19A and 19B, opening 1901 includes a bottom 1905 that includes a portion 1902 of the insulating layer 1001 between portions 1903 and 1904 of the insulating layer 701. As shown in FIGS. 19A and 19B, opening 1901 includes opposing sidewalls 1906 that include portions of the insulating layer 1001. In one embodiment, each sidewall 1906 is substantially orthogonal to bottom 1905. In another embodiment, each sidewall 1906 is slanted relative to bottom 1905 at an angle other than 90 degrees, so that an upper portion of the opening 1901 is greater than a lower portion of the opening 1901.

In one embodiment, opening 1901 having slanted sidewalls is formed using an angled non-selective etch. In one embodiment, hard mask layer 1801 is removed using one or more of wet etching, dry etching, or a combination thereof techniques known to one of ordinary skill in the art of microelectronic device manufacturing. In one embodiment, insulating layer 1001 is removed using a non-selective etch in a trench first dual damascene process. In one embodiment, insulating layer 1001 is etched down to the depth that is determined by time. In another embodiment, insulating layer 1001 is etched non-selectively down to an etch stop layer (not shown). In one embodiment, insulating layer 1001 is non-selectively etched using one or more of wet etching, dry etching, or a combination thereof techniques known to one of ordinary skill in the art of electronic device manufacturing.

Figure 20A:
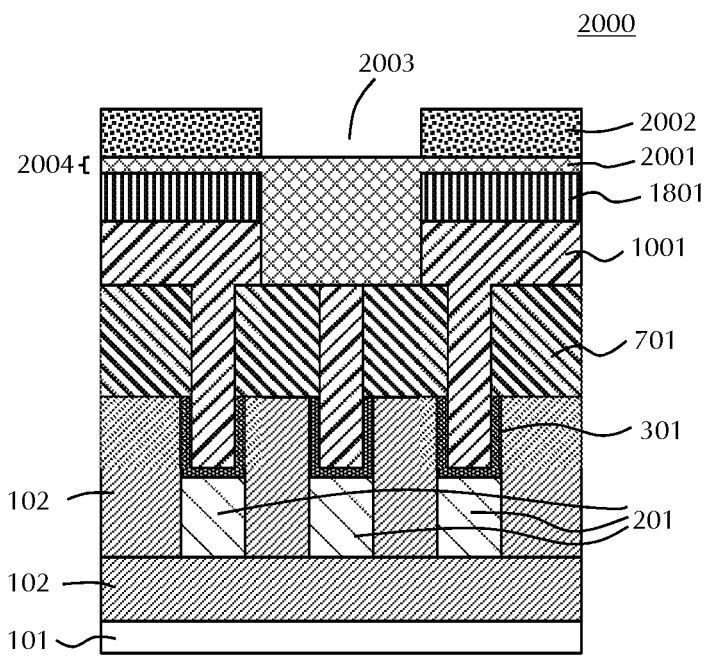
FIG. 20A is a view similar to FIG. 19A after forming a planarization filling layer and mask layer according to one embodiment.
Figure 20B:
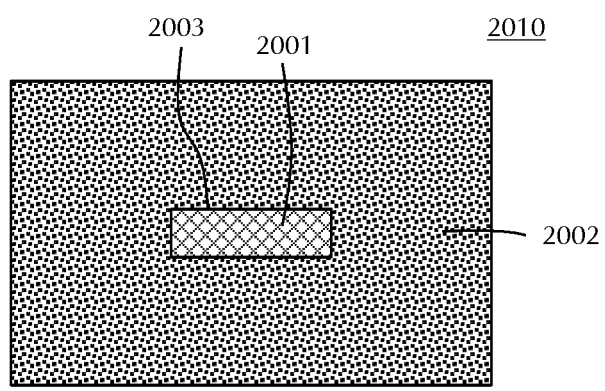
FIG. 20B is a top view of the electronic device structure depicted in FIG. 20A.

FIG. 20A is a view 2000 similar to FIG. 19A, after mask layer 1802 is removed, planarization filling layer 2001 is formed and mask layer 2002 with a fully self-aligned opening 2003 is formed according to one embodiment. FIG. 20B is a top view 2010 of the electronic device structure depicted in FIG. 20A. As shown in FIGS. 20A and 20B, mask layer 1802 is removed. Mask layer 1802 can be removed using one of the mask layer removal techniques known to one of ordinary skill in the art of microelectronic device manufacturing. A planarization filling layer 2001 is formed in opening 1901 onto the tops of exposed insulating layer 701 and insulating layer 1001. The planarization filling layer 2001 illustrated is formed so that an overburden 2004 is formed on hard mask 1801. In some embodiments, the planarization filling layer 2001 is formed to be substantially coplanar with the hard mask 1801. In some embodiments, the planarization filling layer 2001 is planarized, for example, by a CMP process. The planarization filling layer

2001 can be any suitable material including, but not limited to, BARC (Bottom Anti-Reflective Coating) layer (e.g., spin-on polymers containing C and H, or Si), DARC (Dielectric Anti-Reflective Coating) layer or an OPL (Organic Planarization Layer). The planarization filling layer 2001 of some embodiments is deposited by CVD or ALD. In some embodiments, the planarization filling layer 2001 comprises one or more atoms of Si, O, N, C or H.

A patterned mask layer 2002 is formed on hard mask layer 1801. As shown in FIG. 20B, patterned mask layer 2002 is deposited on the planarization filling layer 2001. Patterned mask layer 2002 has an opening 2003. Patterned mask layer 2002 can be formed using one or more of the mask layer depositing, patterning and etching techniques known to one of ordinary skill in the art of microelectronic device manufacturing.

In one embodiment, mask layer 2007 includes a photoresist layer. In one embodiment, mask layer 2007 includes one or more hard mask layers. In one embodiment, mask layer 2007 is tri-layer mask stack, e.g., a 193i or EUV resist mask on a ML (e.g., a silicon containing organic layer or a metal containing dielectric layer) on a BARC layer on a silicon oxide hard mask.

Figure 21A:
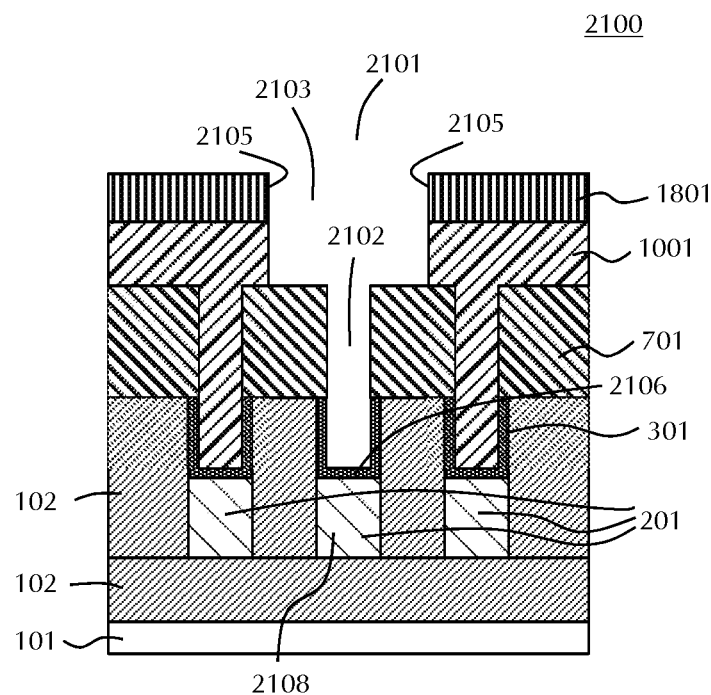
FIG. 21A is a view similar to FIG. 20A after a fully self-aligned opening is formed in insulating layer according to one embodiment.
Figure 21B:
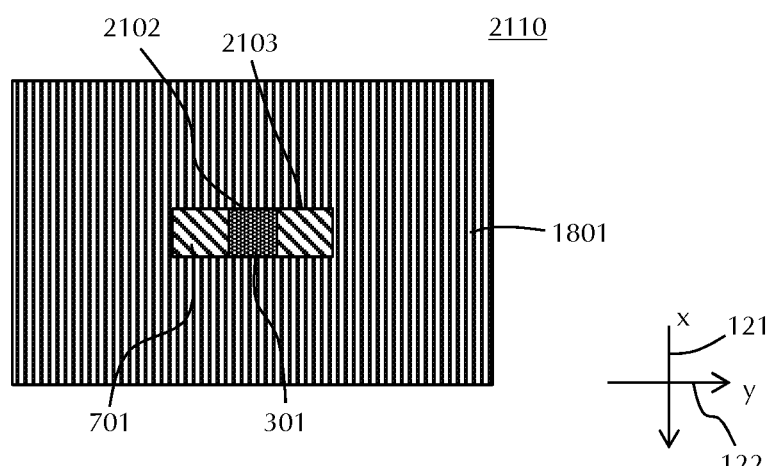
FIG. 21B is a top view of the electronic device structure depicted in FIG. 21A.

FIG. 21A is a view 2100 similar to FIG. 20A, after removing the planarization filling layer 2001 and insulating layer 1001 through opening 2003. The embodiment illustrated has the patterned hard mask layer 2002 and planarization filling layer 2001 removed from hard mask 1801. A fully self-aligned opening 2101 is formed through mask opening 2003. Fully self-aligned opening 2101 includes a trench opening 2103 and a via opening 2102, as shown in FIGS. 21A and 21B. Via opening 2102 is underneath trench opening 2103.

In one or more embodiments, via opening 2102 is formed by selectively etching insulating layer 1001 relative to the insulating layer 701 through mask opening 2003 and trench opening 2103. In one embodiment, trench opening 2103 extends along Y axis 122. As shown in FIG. 21B, trench opening 2103 is greater along Y axis 122 than along X axis 121.

In one embodiment, trench opening 2103 of the opening 2101 is self-aligned along X-axis between the features of the hard mask layer 1801 that are used to pattern the upper metallization layer conductive lines that extend along Y axis 122 (not shown). The via opening 2102 of the opening 2101 is self-aligned along Y-axis 122 by the insulating layer 701 that is left intact by selectively etching the portion 1902 of the insulating layer 1001 relative to the insulating layer 701. This provides an advantage as the size of the trench opening 2103 does not need to be limited to the size of the cross-section between the conductive line 2108 and one of the conductive lines of the upper metallization layer that provides more flexibility for the lithography equipment. As the portion 1902 is selectively removed relative to the insulating layer 701, the size of the trench opening increases.

As shown in FIGS. 19A and 19B, the portion 1902 is self-aligned with a conductive line 2108 that is one of the lower metallization layer conductive lines 201. That is, the opening 2101 is self-aligned along both X and Y axes.

FIG. 21A illustrates trench opening 2103 having sidewalls 2105 that are substantially orthogonal to the top surface of the substrate 101. In some embodiments, each sidewall 2105 is at an angle other than 90 degrees to the top surface of the substrate 101, so that an upper portion of the trench opening 2103 is greater than a lower portion of the trench opening 2103.

As shown in FIGS. 21A and 21B, via opening 2102 exposes a portion 2106 of the liner 301 on conductive line 2108. In another embodiment, when the liner 301 is removed, the via opening 2102 exposes conductive line 2108.

Figure 22A:
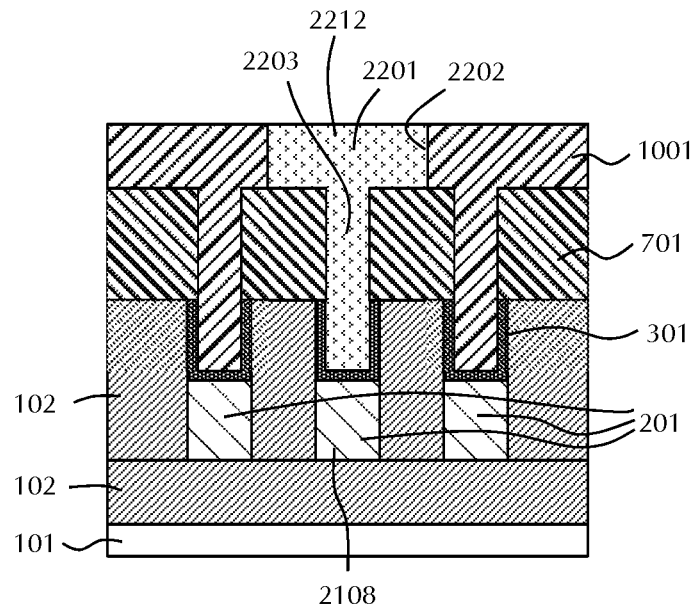
FIG. 22A is a view similar to FIG. 21A after an upper metallization layer comprising conductive lines extending along a Y axis is formed according to one embodiment.
Figure 22B:
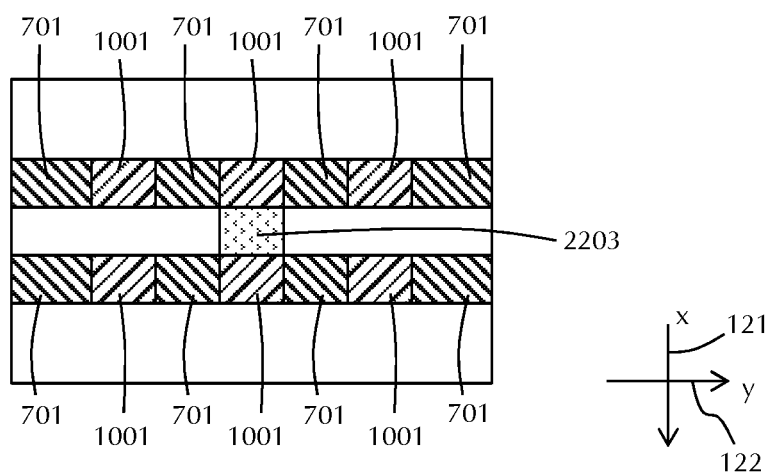
FIG. 22B is a top view of the electronic device structure depicted in FIG. 22A.

FIG. 22A is a view 2200 similar to FIG. 21A, after an upper metallization layer My comprising conductive lines extending along Y axis 122 is formed according to one embodiment. FIG. 22B is a top view 2210 of the electronic device structure depicted in FIG. 22A. FIG. 22A is a cross-sectional view of FIG. 22B taken along an axis C-C'. As shown in FIG. 22A, hard mask layer 1801 is removed. In one embodiment, hard mask layer 1801 is removed using one or more of the hard mask layer removal techniques know in one of ordinary skill in the art of microelectronic device manufacturing.

An upper metallization layer My includes a set of conductive lines 2201 that extend on portions of insulating layer 701. In the embodiment illustrated in FIG. 22A, the conductive lines 2201 are filled to be co-planar with the top of insultaing layer 1001. In some embodiments, the conductive lines 2201 extend above the top surface of insulating layer 1001, similar to that shown in FIG. 17A.

As shown in FIG. 22B, the portions of the insulating layer 1001 are between the portions of the insulating layer 701. Conductive lines 2201 extend along Y axis 122. A fully self-aligned via 2212 includes a trench portion 2202 and a via portion 2203. Via portion 2203 is underneath trench portion 2202. The fully self-aligned via 2212 is between the lower metallization layer comprising conductive lines 201 that extend along X axis 121 and the upper metallization layer comprising conductive lines 2201. As shown in FIGS. 22A and 22B, the via portion 2203 is on liner 301 on conductive line 2108. As shown in FIGS. 22A and 22B, the via portion 2203 of the via 2212 is self-aligned along the Y axis 122 to conductive line 2108 that is one of the conductive lines 201. The trench portion 2203 of the via 2212 is self-aligned along the X axis 121. In one embodiment, when liner 301 is removed, the via portion 2203 is directly on conductive line 2108.

In one embodiment, forming the conductive lines 2201 and via 2212 involves filling the trenches in the insulating layer and the opening 2101 with a layer of conductive material. In one embodiment, a base layer (not shown) is first deposited on the internal sidewalls and bottom of the trenches and the opening 2101, and then the conductive layer is deposited on the base layer. In one embodiment, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g, copper).

In one embodiment, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer e.g., copper, is deposited onto the seed layer of base later of copper, by an electroplating process. In one embodiment, the conductive layer is deposited into the trenches using a damascene process known to one of ordinary skill in the art of microelectronic device manufacturing. In one embodiment, the conductive layer is deposited onto the seed layer in the trenches and in the opening 1601 using a selective deposition technique, such as but not limited to electroplating, electroless, a CVD, PVD, MBE, MOCVD, ALD, spin-on, or other deposition techniques known to one of ordinary skill in the art of microelectronic device manufacturing.

In one embodiment, the choice of a material for conductive layer for the conductive lines 2201 and via 2212 determines the choice of a material for the seed layer. For example, if the material for the conductive lines 2201 and via 2212 includes copper, the material for the seed layer also includes copper. In one embodiment, the conductive lines 2201 and via 2212 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 2201 and via 2212 are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, portions of the conductive layer and the base layer are removed to even out top portions of the conductive lines 2201 with top portions of the insulating layer 1001 using a chemical-mechanical polishing ("CMP") technique known to one of ordinary skill in the art of microelectronic device manufacturing.

In one non-limiting example, the thickness of the conductive lines 2201 is in an approximate range from about 15 nm to about 1000 nm. In one non-limiting example, the thickness of the conductive lines 2201 is from about 20 nm to about 200 nm. In one non-limiting example, the width of the conductive lines 2201 is in an approximate range from about 5 nm to about 500 nm. In one non-limiting example, the spacing (pitch) between the conductive lines 2201 is from about 2 nm to about 500 nm. In more specific non-limiting example, the spacing (pitch) between the conductive lines 2201 is from about 5 nm to about 50 nm.

In an embodiment, the upper metallization layer My is configured to connect to other metallization layers (not shown). In an embodiment, the metallization layer My is configures to provide electrical contact to electronic devices, e.g., transistors, memories, capacitors, resistors, optoelectronic devices, switches, and any other active and passive electronic devices, switches, that are separated by an electrically insulating layer, for example, an interlayer dielectric, a trench insulation layer, or any other insulating layer known to one or ordinary skill in the art of electronic device manufacturing.

Figure 23:
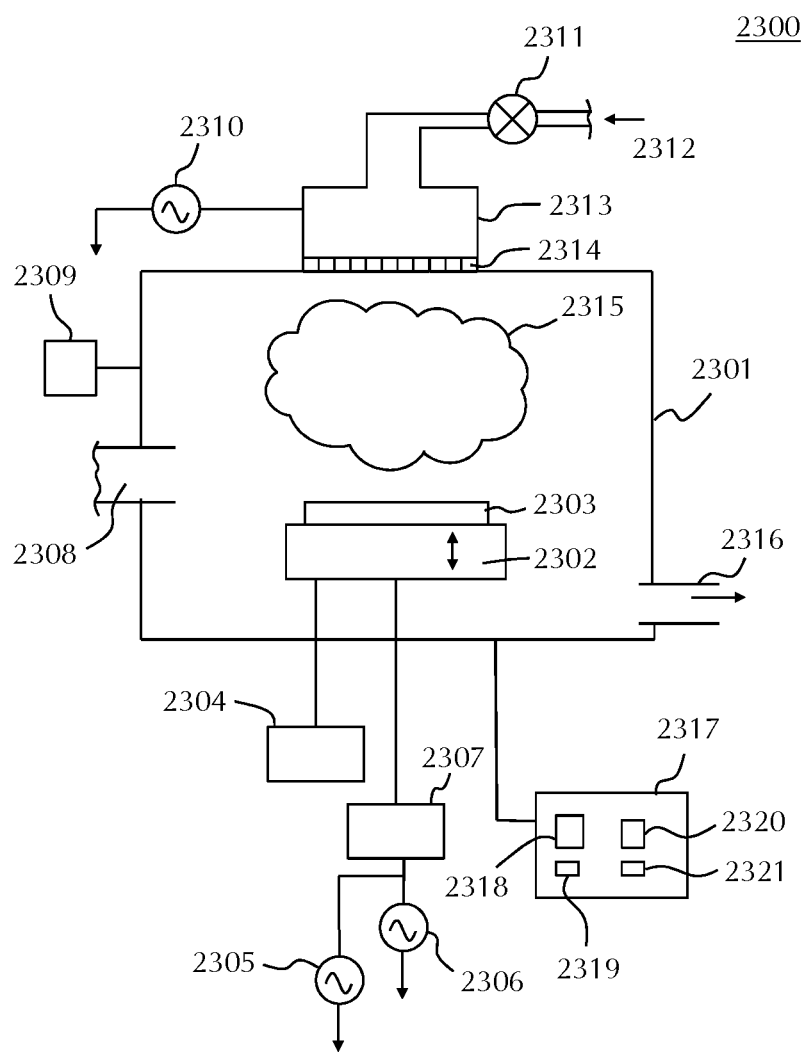
FIG. 23 shows a block diagram of a plasma system to provide a fully self-aligned via according to one embodiment.

FIG. 23 shows a block diagram of a plasma system to perform at least some of the operations to provide a fully self-aligned via according to one embodiment. As shown in FIG. 23, system 2300 has a processing chamber 2301. A movable pedestal 2302 to hold an electronic device structure 2303 is placed in processing chamber 2301. Pedestal 2302 comprises an electrostatic chuck ("ESC"), a DC electrode embedded into the ESC, and a cooling/heating base. In an embodiment, pedestal 2301 acts as moving cathode. In an embodiment, the ESC comprises an $Al_2O_3$ material, $Y_2O_3$ or other ceramic materials known to one of ordinary skill of electronic device manufacturing. A DC power supply 2304 is connected to the DC electrode of the pedestal 2302.

As shown in FIG. 23, an electronic device structure 2303 is loaded through an opening 2308 and placed on the pedestal 2302. The electronic device structure 2303 represents one of the electronic device structures described above. System 2300 comprises an inlet to input one or more process gases 2312 through a mass flow controller 2311 to a plasma source 2313. A plasma source 2313 comprising a showerhead 2314 is coupled to the processing chamber 2301 to receive one or more gases 2312 to generate plasma. Plasma source 2313 is coupled to a RF source power 2310. Plasma source 2313 through showerhead 2314 generates a plasma 2315 in processing chamber 2301 from one or more process gases 2312 using a high frequency electric field. Plasma 2315 comprises plasma particles, such as ions, electrons, radicals, or any combination thereof. In an embodiment, power source 2310 supplies power from about 50 W to about 3000 W at a frequency from about 400 kHz to about 162 MHz to generate plasma 2315.

A plasma bias power 2305 is coupled to the pedestal 2302 (e.g., cathode) via a RF match 2307 to energize the plasma. In an embodiment, the plasma bias power 2305 provides a bias power that is not greater than 1000 W at a frequency between about 2 MHz to 60 MHz, and in a particular embodiment at about 13 MHz. A plasma bias power 2306 may also be provided, for example, to provide another bias power that is not greater than 1000 W at a frequency from about 400 kHz to about 60 MHz, and in a particular embodiment, at about 60 MHz. Plasma bias power 2306 and bias power 2305 are connected to RF match 2307 to provide a dual frequency bias power. In an embodiment, a total bias power applied to the pedestal 2302 is from about 10 W to about 3000 W.

As shown in FIG. 23, a pressure control system 2309 provides a pressure to processing chamber 2301. As shown in FIG. 23, chamber 2301 has one or more exhaust outlets 2316 to evacuate volatile products produced during processing in the chamber. In an embodiment, the plasma system 2300 is an inductively coupled plasma (ICP) system. In an embodiment, the plasma system 2300 is a capacitively coupled plasma (CCP) system.

A control system 2317 is coupled to the chamber 2301. The control system 2317 comprises a processor 2318, a temperature controller 2319 coupled to the processor 2318, a memory 2320 coupled to the processor 2318, and input/output devices 2321 coupled to the processor 2318 to form fully self-aligned via as described herein.

In one embodiment, the processor 2318 has a configuration to control recessing first conductive lines on a first insulating layer on a substrate, the first conductive lines extending along a first direction on the first insulating layer. The processor 2318 has a configuration to control depositing a liner on the recessed first conductive lines. The processor has a configuration to control selectively growing a seed layer on the recessed first conductive lines. The processor 2318 has a configuration to control forming pillars using the selectively grown seed layer. The processor 2318 has a configuration to control depositing a second insulating layer between the pillars. The processor 2318 has a configuration to control removing the pillars to form trenches in the second insulating layer. The processor 2318 has a configuration to control depositing a third insulating layer into the trenches in the second insulating layer. The processor 2318 has a configuration to control selectively etching the third insulating layer relative to the second insulating layer to form a fully self-aligned via opening down to one of the first conductive lines. The processor 2318 has a configuration to control depositing a conductive layer into the self-aligned via opening, as described above.

The control system 2317 is configured to perform at least some of the methods as described herein and may be either software or hardware or a combination of both. The plasma system 2300 may be any type of high performance processing plasma systems known in the art, such as but not limited to, an etcher, a cleaner, a furnace, or any other plasma system to manufacture electronic devices.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method to provide a self-aligned via, comprising:
    recessing first conductive lines on a first insulating layer on a substrate, the first conductive lines extending along a first direction on the first insulating layer;
    forming pillars on the recessed first conductive lines;
    depositing a second insulating layer between the pillars;
    removing the pillars to form trenches in the second insulating layer;
    depositing a third insulating layer through the trenches onto the recessed first conductive lines; and
    etching the third insulating layer selectively relative to the second insulating layer to form a via opening down to one of the first conductive lines.

2. The method of claim 1, wherein the via opening is self-aligned along the first direction and a second direction to the one of the first conductive lines, the second direction crossing the first direction at an angle.

3. The method of claim 1, further comprising selectively growing a seed layer on the recessed first conductive lines, wherein the pillars are formed on the seed layer.

4. The method of claim 1, further comprising forming a hard mask layer on at least one of the second insulating layer and the third insulating layer.

5. The method of claim 1, further comprising depositing a liner on the recessed first conductive lines.

6. The method of claim 1, further comprising depositing a conductive layer into the via opening.

7. The method of claim 1, wherein the via opening has a trench portion and a via portion underneath the trench portion.

8. A processor-implemented method for forming fully self-aligned vias, the method comprising:
    receiving data for a first configuration to control recessing first conductive lines on a first insulating layer on a substrate, the first conductive lines extending along a first direction on the first insulating layer;
    receiving data for a second configuration to control forming pillars on the recessed first conductive lines;
    receiving data for a third configuration to control depositing a second insulating layer between the pillars;
    receiving data for a fourth configuration to control removing the pillars to form trenches in the second insulating layer;
    receiving data for a fifth configuration to control depositing a third insulating layer through the trenches onto the recessed first conductive lines;
    receiving data for a sixth configuration to control etching the third insulating layer selectively relative to the second insulating layer to form a fully self-aligned via opening down to one of the recessed first conductive lines; and
    performing one or more of the first configuration, second configuration, third configuration, fourth configuration, fifth configuration, or sixth configuration.

9. The processor-implemented method of claim 8, wherein the fully self-aligned via opening is self-aligned along the first direction and a second direction, the second direction crossing the first direction at an angle.

10. The processor-implemented method of claim 8, further comprising receiving data for a sixth configuration to control selectively growing a seed layer on the recessed first conductive lines, wherein the pillars are formed on the seed layer.

11. The processor-implemented method of claim 8, further comprising receiving data for a seventh configuration to control forming a hard mask layer on at least one of the second insulating layer and the third insulating layer.

12. The processor-implemented method of claim 8, further comprising receiving data for an eighth configuration to control depositing a liner on the recessed first conductive lines.

13. The processor-implemented method of claim 8, further comprising receiving data for a ninth configuration to control depositing a conductive layer into the fully self-aligned via opening.

14. The processor-implemented method of claim 8, wherein the fully self-aligned via opening has a trench portion and a via portion underneath the trench portion.

* * * * *

UNITED STATES PATENT AND TRADEMARK OFFICE
CERTIFICATE OF CORRECTION

Page 1 of 1

PATENT NO. : 10,410,921 B2
APPLICATION NO. : 16/272059
DATED : September 10, 2019
INVENTOR(S) : Zhang et al.

It is certified that error appears in the above-identified patent and that said Letters Patent is hereby corrected as shown below:

In the Specification

In Column 5, Line 43, replace "descried" with "described".

In Column 14, Line 50, replace "NOCVD" with "MOCVD".

In Column 22, Line 21, replace "insultaing" with "insulating".

Signed and Sealed this
Twenty-ninth Day of October, 2019

Andrei Iancu
*Director of the United States Patent and Trademark Office*